US011477553B2

United States Patent
Kim et al.

(10) Patent No.: US 11,477,553 B2
(45) Date of Patent: Oct. 18, 2022

(54) DISPLAY DEVICE

(71) Applicant: Samsung Display Co., LTD., Yongin-si (KR)

(72) Inventors: Jong Tae Kim, Seoul (KR); Sang Wook Yoo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 249 days.

(21) Appl. No.: 16/852,566

(22) Filed: Apr. 20, 2020

(65) Prior Publication Data
US 2021/0058691 A1   Feb. 25, 2021

(30) Foreign Application Priority Data

Aug. 20, 2019 (KR) .................. 10-2019-0101470

(51) Int. Cl.
*H04R 1/02* (2006.01)
*H01L 27/32* (2006.01)

(52) U.S. Cl.
CPC ......... *H04R 1/028* (2013.01); *H01L 27/3225* (2013.01); *H01L 27/3244* (2013.01); *H04R 2499/15* (2013.01)

(58) Field of Classification Search
CPC  H04R 1/028; H04R 2499/15; H04R 2217/01; H04R 1/021; H04R 1/023; H04R 17/005; H04R 2400/03; H04R 2499/11; H04R 1/20; H04R 7/045; H04R 1/2811; H04R 17/00; H01L 27/3225; H01L 27/3244; H05K 7/20954
See application file for complete search history.

(56) References Cited

U.S. PATENT DOCUMENTS

| 8,571,248 | B2 * | 10/2013 | Li .............................. H04R 9/06 381/345 |
| 2014/0153213 | A1 * | 6/2014 | Oh .......................... G06F 3/043 362/19 |
| 2015/0341714 | A1 * | 11/2015 | Ahn ....................... H04R 7/045 381/333 |
| 2017/0246662 | A1 | 8/2017 | Kidwell, Jr. et al. |
| 2019/0037165 | A1 * | 1/2019 | Lee .......................... H04R 5/02 |

FOREIGN PATENT DOCUMENTS

| CN | 107347168 A | * 11/2017 | ............... H04R 1/02 |
| JP | S6224391 Y2 | * 6/1987 | ............. G11B 33/12 |
| KR | 101293558 B1 | 8/2013 | |
| KR | 1020160015805 A | 2/2016 | |
| KR | 101685962 B1 | 12/2016 | |
| KR | 1020190018084 A | 2/2019 | |

* cited by examiner

*Primary Examiner* — Oyesola C Ojo
(74) *Attorney, Agent, or Firm* — Cantor Colburn LLP

(57) ABSTRACT

A display device includes: a display panel including a substrate and a pixel array layer disposed on a surface of the substrate; a sound generation device disposed on an opposing surface opposite to the surface of the substrate; and a set cover including a plurality of ribs which overlap the sound generation device in a thickness direction of the display panel. The sound generation device vibrates the display panel to output a sound.

20 Claims, 30 Drawing Sheets

DISPLAY DEVICE

This application claims priority to Korean Patent Application No. 10-2019-0101470 filed on Aug. 20, 2019, and all the benefits accruing therefrom under 35 U.S.C. § 119, the content of which in their entirety is herein incorporated by reference.

BACKGROUND

1. Field

Embodiments of the invention relate to a display device.

2. Description of the Related Art

As the information society develops, the demand for display devices for displaying images is increasing in various forms. For example, display devices are applied to various electronic devices such as smart phones, digital cameras, notebook computers, navigation devices, and smart televisions. The display devices may include display panels for displaying images and sound generation devices for generating sounds by vibrating the display panels.

SUMMARY

Embodiments of the invention provide a display device with improved acoustic performance and improved heat dissipation characteristic.

Embodiments of the invention also provide a display device which is robust to an external impact.

An embodiment of the invention provides a display device including: a display panel including a substrate and a pixel array layer disposed on a surface of the substrate; a sound generation device disposed on an opposing surface opposite the surface of the substrate, where the sound generation device vibrates the display panel to output a sound; and a set cover including a plurality of ribs which overlap the sound generation device in a thickness direction of the display panel.

In an embodiment, the plurality of ribs may extend in a first direction and may be arranged in a second direction crossing the first direction.

In an embodiment, the set cover may include a lower cover and a bracket disposed between the display panel and the lower cover, and the ribs may be disposed in the bracket.

In an embodiment, a slit may be defined in the bracket between adjacent ribs among the plurality of ribs. In such an embodiment, the slit may be defined through the bracket in the thickness direction.

In an embodiment, a width of the rib in the second direction may be smaller than a width of the slit in the second direction.

In an embodiment, the sound generation device may include: a first electrode to which a first driving voltage is applied; a second electrode to which a second driving voltage is applied; and a vibration layer between the first electrode and the second electrode, where the vibration layer may retract or expand based on the first driving voltage and the second driving.

In an embodiment, the rib may include an upper surface, a lower surface, and a side surface disposed between the upper surface and the lower surface. In such an embodiment, a width of the upper surface in the second direction may be smaller than a width of the lower surface in the second direction.

In an embodiment, the rib may include an upper surface, a lower surface, a first side surface disposed between the upper surface and the lower surface, and a second side surface facing the first side surface. In such an embodiment, the first side surface may be perpendicular to the lower surface, and the second side surface may include an inclined surface forming an acute angle with respect to the lower surface.

In an embodiment, the set cover may include a lower cover and a bracket disposed between the display panel and the lower cover. In such an embodiment, the ribs may be disposed in the lower cover.

In an embodiment, a slit may be defined in the lower cover between adjacent ribs among the plurality of ribs. In such an embodiment, the slit may be defined through the lower cover in the thickness direction.

In an embodiment, an opening may be defined through the bracket to expose the sound generation device. In such an embodiment, the opening may overlap the rib and the slit of the lower cover in the thickness direction.

In an embodiment, a width of the rib may be smaller than a width of the slit.

In an embodiment, the rib may include an upper surface, a lower surface, and a side surface disposed between the upper surface and the lower surface. In such an embodiment, a width of the upper surface may be smaller than a width of the lower surface.

In an embodiment, the side surface of the rib may include a first side surface and a second side surface facing the first side surface. In such an embodiment, the first side surface may be perpendicular to the lower surface, and the second side surface may include an inclined surface forming a predetermined angle with respect to the lower surface.

An embodiment of the invention provides a display device including: a display panel; a sound generation device attached to a surface of the display panel; and a bracket which accommodates the display panel and the sound generation device, where the bracket includes a plurality of slits and a plurality of ribs which overlap the sound generation device in a thickness direction of the display panel. In such an embodiment, the plurality of slits and the plurality of ribs are alternately disposed in a lateral direction.

In an embodiment, the slits may be defined through the bracket in the thickness direction.

In an embodiment, a width of the rib in the lateral direction may be smaller than a width of the slit in the lateral direction.

In an embodiment, the sound generation device may include: a first electrode to which a first driving voltage is applied; a second electrode to which a second driving voltage is applied; and a vibration layer disposed between the first electrode and the second electrode, where the vibration layer may retract or expand based on the first driving voltage and the second driving voltage.

In an embodiment, the width of the rib may be smaller than a width of the bracket.

In an embodiment, the rib may include an upper surface, a lower surface, and a side surface disposed between the upper surface and the lower surface. In such an embodiment, a width of the upper surface in the lateral direction may be smaller than a width of the lower surface in the lateral direction.

BRIEF DESCRIPTION OF THE DRAWINGS

The above and other embodiments and features of the invention will become more apparent by describing in detail embodiments thereof with reference to the accompanying drawings, in which.

DETAILED DESCRIPTION

Figure 1:
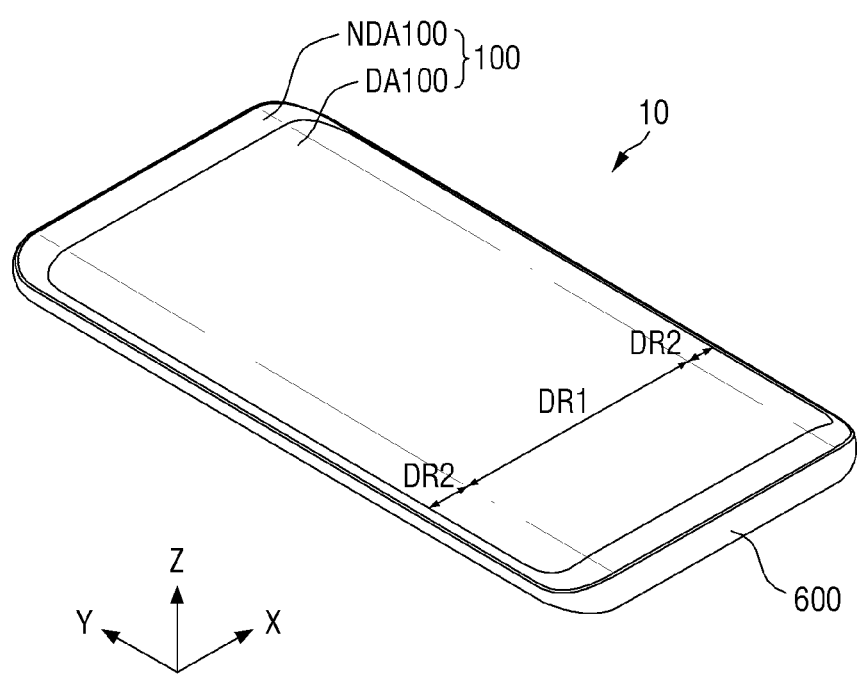
FIG. 1 is a perspective view illustrating a display device according to an embodiment.

The invention will now be described more fully hereinafter with reference to the accompanying drawings, in which preferred embodiments of the invention are shown. The invention may, however, be embodied in different forms and should not be construed as limited to the exemplary embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Hereinafter, embodiments of the invention will be described in detail with reference to the accompanying drawings.

Figure 2:
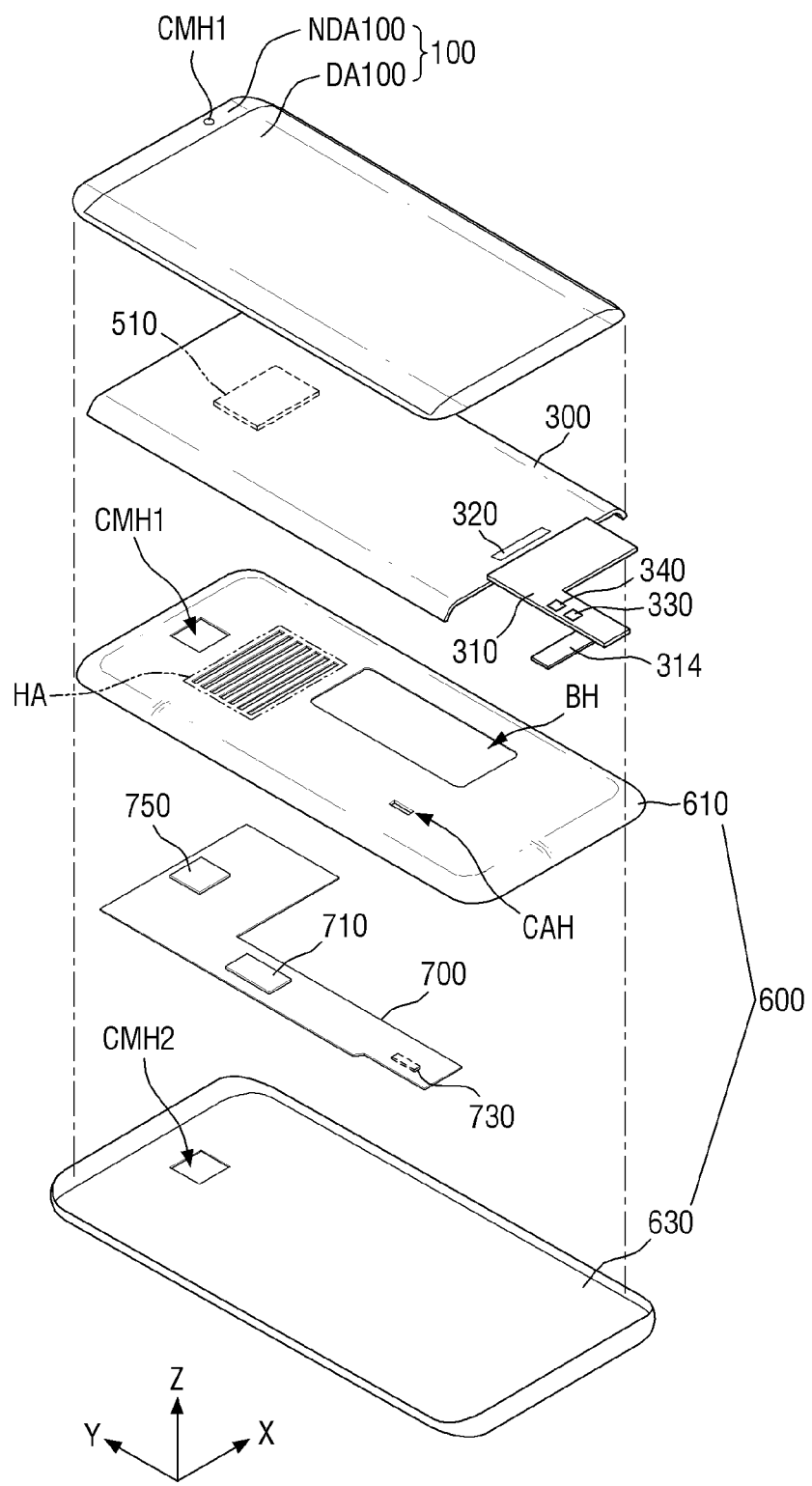
FIG. 2 is an exploded perspective view of the display device according to an embodiment.
Figure 3:
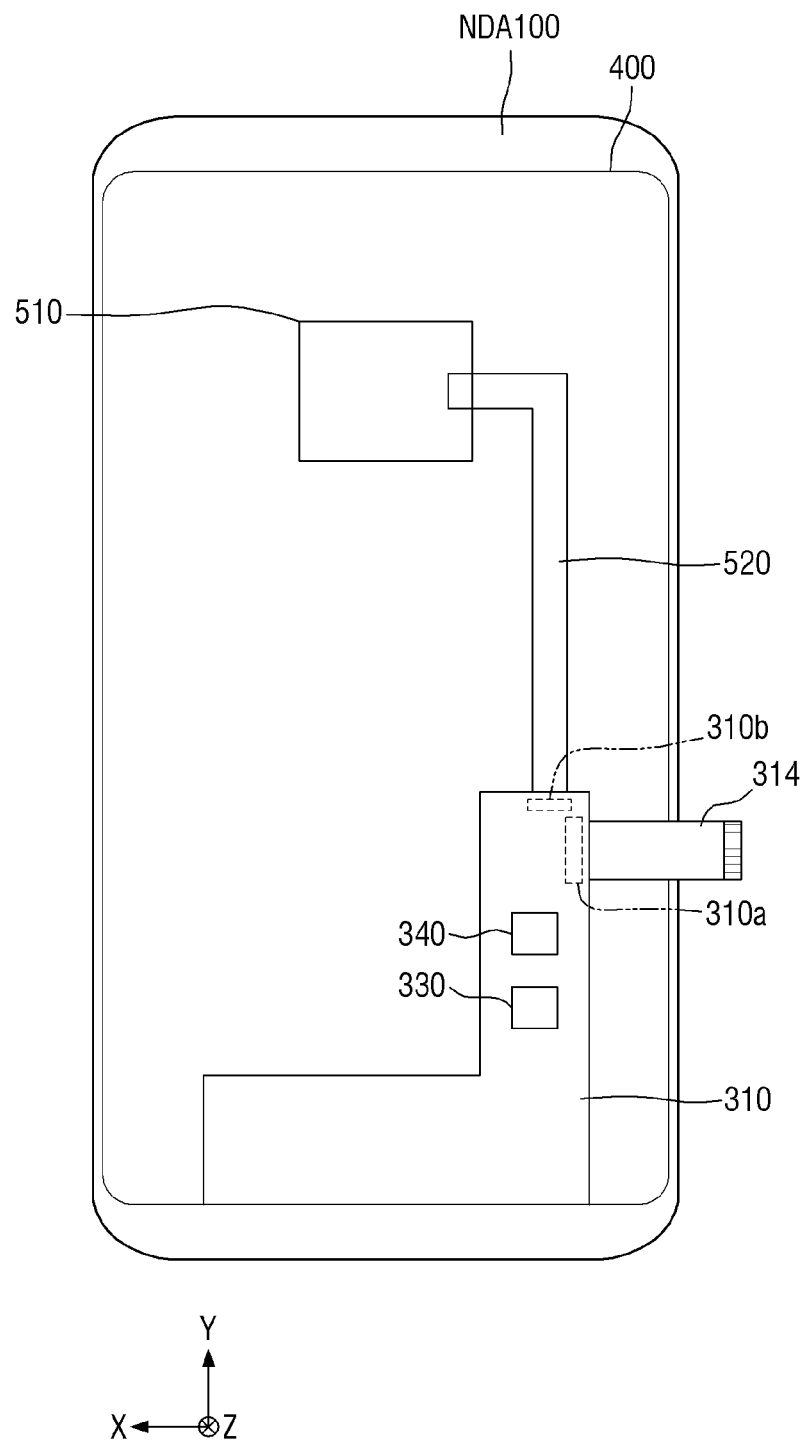
FIG. 3 is a bottom view of a display panel attached to a cover window.
Figure 4:
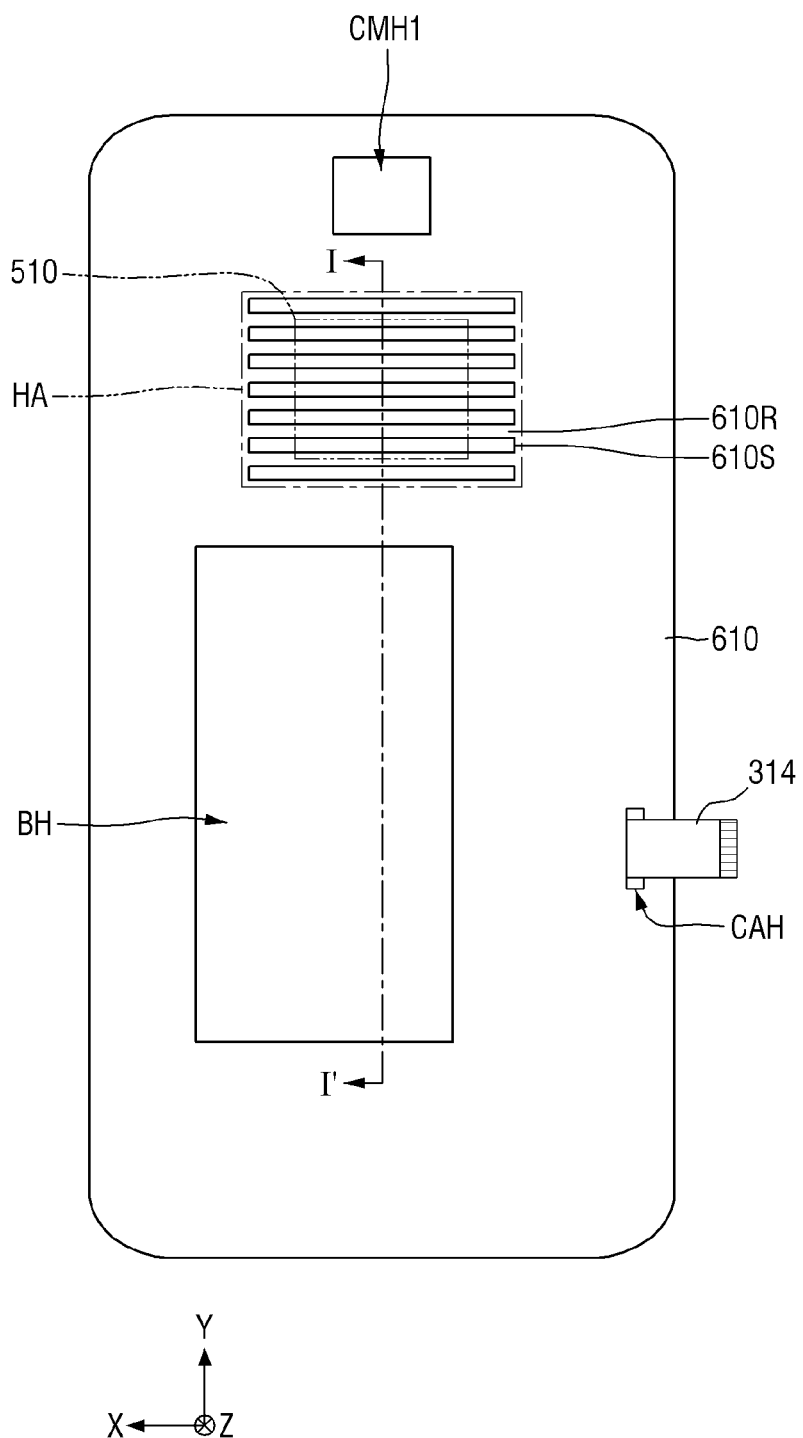
FIG. 4 is a bottom view of a bracket attached to the display panel.
Figure 5:
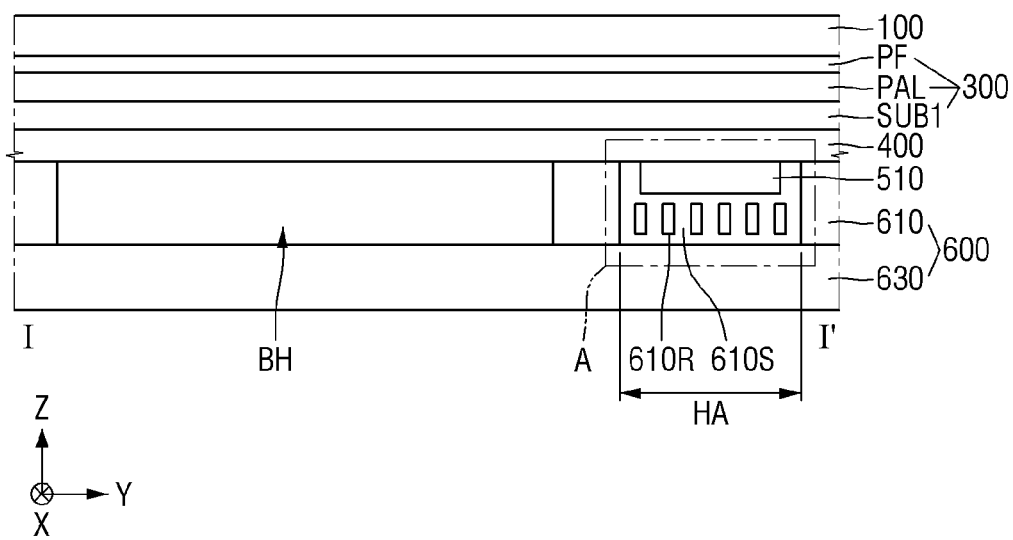
FIG. 5 is a cross-sectional view taken along line I-I' of FIG. 4.
Figure 6:
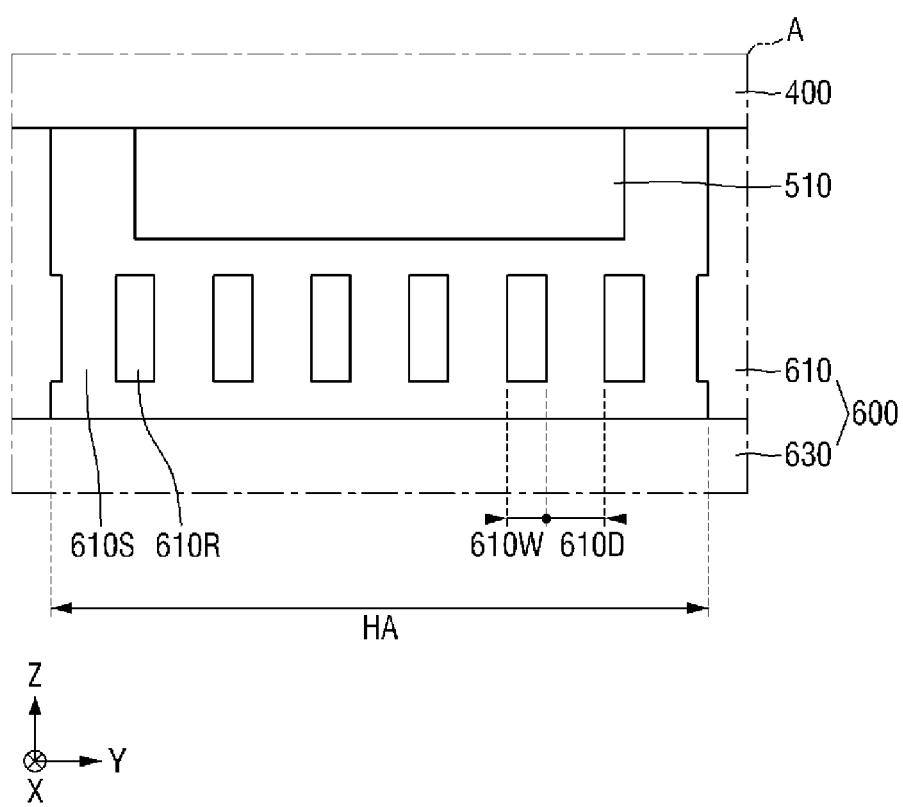
FIG. 6 is an enlarged cross-sectional view of area A of FIG. 5.
Figure 7:
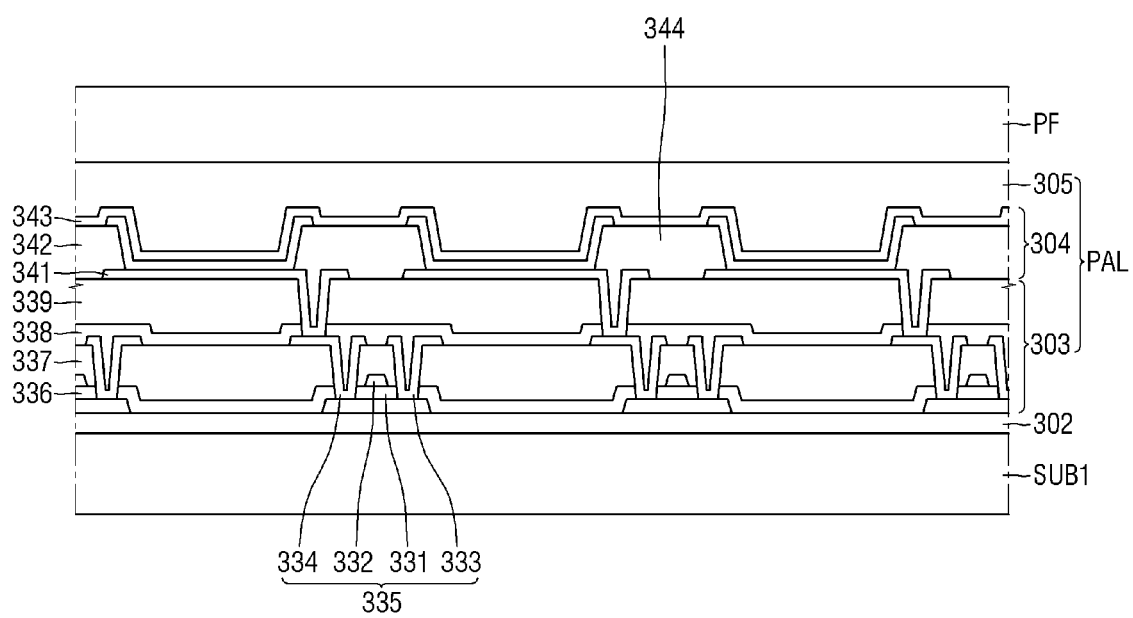
FIG. 7 is a cross-sectional view of a display area of the display panel according to an embodiment.

FIG. 1 is a perspective view illustrating a display device according to an embodiment. FIG. 2 is an exploded perspective view of the display device according to an embodiment. FIG. 3 is a bottom view of a display panel attached to a cover window. FIG. 4 is a bottom view of a bracket attached to the display panel. FIG. 5 is a cross-sectional view taken along line I-I' of FIG. 4. FIG. 6 is an enlarged cross-sectional view of area A of FIG. 5. FIG. 7 is a cross-sectional view of a display area of the display panel according to an embodiment.

Referring to FIGS. 1 to 7, an embodiment of a display device 10 may include a cover window 100, a display panel 300, a display circuit board 310, a display drive circuit 320, a lower panel cover 400, a sound generation device 510, a set cover 600, and a main circuit board 700.

Herein, the terms "above," "top," and "upper surface" refer to a direction in which the cover window 100 is disposed based on the display panel 300, i.e., a Z-axis direction, and terms "below," "bottom," and "lower surface" refer to a direction in which a bracket 610 is disposed based on the display panel 300, i.e., a direction opposite to the Z-axis direction. Further, the terms "left," "right," "upper," and "lower" refer to directions when the display panel 300 is viewed from above. For example, the term "left" refers to a direction opposite an X-axis direction, the term "right" refers to an X-axis direction, the term "upper" refers to the Z-axis direction, and the term "lower" refers to a direction opposite the Z-axis direction.

The display device 10 may be in a rectangular shape when viewed from a plan view in a thickness direction thereof (Z-axis direction). In an embodiment, as shown in FIGS. 1 and 2, the display device 10 may have a rectangular planar shape which has a short side in a first direction X and a long side in a second direction Y. A corner at which the short side in the first direction X (X-axis direction) and the long side in the second direction Y (Y-axis direction) meet may be rounded to have a predetermined curvature or at a right angle. A planar shape of the display device 10 is not limited to the rectangular shape and may have another square shape such as a circular shape, or an elliptical shape, for example.

The display device 10 may include a first flat area DR1 and second areas DR2 extending from left and right sides of the first area DR1. The second area DR2 may be formed to be flat or formed as a curved surface. When the second area DR2 is formed to be flat, an angle between the first area DR1 and the second area DR2 may be an obtuse angle. When the second area DR2 is formed as the curved surface, the second area DR2 may have a constant curvature or a variable curvature.

In an embodiment, as shown in FIG. 1, the second area DR2 extends from each of the left and right sides of the first area DR1, but the disclosure is not limited thereto. Alternatively, the second area DR2 may extend from only one of the left and right sides of the first area DR1. Alternatively, the second area DR2 may extend from at least one of upper and lower sides of the first area DR1 as well as the left and right sides thereof. Hereinafter, for convenience of description, embodiments where the second areas DR2 are disposed on edges of the left and right sides of the display device 10 will be described in detail, but not being limited thereto.

In an embodiment, the cover window 100 may be disposed above the display panel 300 to cover an upper surface of the display panel 300. Thus, the cover window 100 may serve to protect the upper surface of the display panel 300.

In such an embodiment, as shown in FIG. 2, the cover window 100 may include a light transmission portion DA100 corresponding to the display panel 300 and a light blocking portion NDA100 corresponding to an area except for the display panel 300. The cover window 100 may be disposed in the first area DR1 and the second areas DR2. The light transmission portion DA100 may be disposed in a portion of the first area DR1 and portions of the second areas DR2. The light blocking portion NDA100 may be formed to be opaque. The cover window 100 may include or be made of a glass, sapphire, and/or a plastic.

The display panel 300 may be disposed below the cover window 100. The display panel 300 may be disposed to overlap the light transmission portion DA100 of the cover window 100. The display panel 300 may be disposed in the first area DR1 and the second areas DR2. Thus, an image on the display panel 300 may be seen not only in the first area DR1 but also in the second areas DR2.

The display panel 300 may be a light emitting display panel including a light emitting element. In one embodiment, for example, the display panel 300 may be an organic light emitting display panel using an organic light emitting diode ("LED") including an organic light emitting layer, a micro LED display panel using a micro LED, a quantum dot light emitting display panel using a quantum dot LED including a quantum dot emitting layer, or an inorganic light emitting display panel using an inorganic light emitting element including an inorganic semiconductor. Hereinafter, for convenience of description, embodiments where the display panel 300 is an organic light emitting display panel will be described in detail, but not being limited thereto.

In an embodiment, as shown in FIG. 7, the display panel 300 may include a substrate SUB1, a pixel array layer PAL, and a polarizing film PF.

The substrate SUB1 may be a rigid substrate or a flexible substrate which is bendable, foldable, rollable, or the like. The substrate SUB1 may include or be made of an insulating material such as a glass, quartz, a polymer resin, or the like. In an embodiment, the polymer material may include polyethersulphone ("PES"), polyacrylate ("PA"), polyarylate ("PAR"), polyetherimide ("PEI"), polyethylenenaphthalate ("PEN"), polyethylene terephthalate ("PET"), polyphenylenesulfide ("PPS"), polyallylate, polyimide ("PI"), polycarbonate ("PC"), or a combination thereof, for example. The substrate SUB1 may include a metal material.

The pixel array layer PAL may be disposed on the substrate SUB1. Referring to FIG. 7, the pixel array layer PAL may include a thin film transistor layer 303, a light emitting element layer 304, and a thin film encapsulation layer 305.

A buffer film 302 is disposed on the substrate SUB1, and the thin film transistor layer 303 is disposed on the buffer film 302. The thin film transistor layer 303 includes thin film transistors 335, a gate insulating film 336, an interlayer insulating film 337, a protective film 338, and a planarization film 339.

The buffer film 302 may be disposed on the substrate SUB1 to protect the thin film transistors 335 and light emitting elements from moisture infiltrating through the substrate SUB1 which is vulnerable to moisture infiltration. The buffer film 302 may include a plurality of inorganic layers which are alternately stacked one on another.

Each of the thin film transistors 335 includes an active layer 331, a gate electrode 332, a source electrode 333, and a drain electrode 334.

The active layer 331 may include or be formed of a silicon-based semiconductor material or an oxide-based semiconductor material. The gate insulating film 336 may be disposed on the active layer 331. The gate insulating film 336 may include or be formed of an inorganic film, e.g., a silicon oxide (SiOx) film, a silicon nitride (SiNx) film, or a multilayered film thereof.

The gate electrode 332 and a gate line may be disposed on the gate insulating film 336. Each of the gate electrode 332 and the gate line may be formed of a single layer, which include or is made of at least one material selected from molybdenum (Mo), aluminum (Al), chromium (Cr), gold (Au), titanium (Ti), nickel (Ni), neodymium (Nd), copper (Cu) and a combination (e.g., an alloy) thereof, or a multilayer thereof.

The interlayer insulating film 337 may be disposed on the gate electrode 332 and the gate line. The interlayer insulating film 337 may include or be formed of an inorganic layer, e.g., a $SiO_x$ layer, a $SiN_x$ layer, or a multilayer thereof.

The source electrode 333, the drain electrode 334, and a data line may be disposed on the interlayer insulating film 337. Each of the source electrode 333 and the drain electrode 334 may be connected to the active layer 331 through a contact hole defined through the gate insulating film 336 and the interlayer insulating film 337. Each of the source electrode 333, the drain electrode 334, and a data line may be formed of a single layer, which include or is made of at least one material selected from Mo, Al, Cr, Au, Ti, Ni, Nd, Cu and a combination thereof, or a multilayer thereof.

The protective film 338 may be disposed on the source electrode 333, the drain electrode 334 and the data line to insulate the thin film transistor 335. The protective film 338 may include or be formed of an inorganic layer, e.g., a $SiO_x$ layer, a $SiN_x$ layer, or a multilayer thereof.

The planarization film 339 may be disposed on the protective film 338 to planarize a step due to the thin film transistor 335. The planarization film 339 may include or be formed of an organic film such as acrylic resin, epoxy resin, phenolic resin, polyamide resin, PI resin, or the like.

The light emitting element layer 304 is disposed on the thin film transistor layer 303. The light emitting element layer 304 may include light emitting elements and a pixel defining film 344.

The light emitting elements and the pixel defining film 344 are disposed on the planarization film 339. The light emitting element may be an organic light emitting device and include an anode electrode 341, a light emitting layer 342, and a cathode electrode 343.

The anode electrode 341 may be disposed on the planarization film 339. The anode electrode 341 may be connected to the source electrode 333 of the thin film transistor 335 through a contact hole defined through the protective film 338 and the planarization film 339.

In an embodiment, the pixel defining film 344 may be disposed to cover an edge of the anode electrode 341 on the planarization film 339 for pixel partition. In such an embodiment, the pixel defining film 344 serves as a pixel defining layer which defines emission areas of the pixels. Each of the pixels represents an area in which the anode electrode 341, the light emitting layer 342, and the cathode electrode 343 are sequentially stacked and in which holes from the anode electrode 341 and electrons from the cathode electrode 343 are combined in the light emitting layer 342 to emit light.

The light emitting layer 342 is disposed on the anode electrode 341 and the pixel defining film 344. The light emitting layer 342 may be an organic light emitting layer. The light emitting layer 342 may emit one of a red light, a green light and a blue light. Alternatively, the light emitting layer 342 may be a white light emitting layer which emits a white light. In such an embodiment, the light emitting layer 342 may have a structure in which a red light emitting layer, a green light emitting layer, and a blue light emitting layer are stacked one on another and may be a common layer which is commonly disposed in the pixels. In such an embodiment, the display panel 300 may further include separate color filters for exhibiting a red color, a green color, and a blue color.

The cathode electrode 343 is disposed on the light emitting layer 342. The cathode electrode 343 may be disposed to cover the light emitting layer 342. The cathode electrode 343 may be a common layer which is commonly disposed in the pixels.

The thin film encapsulation layer 305 is disposed on the light emitting element layer 304. The thin film encapsulation layer 305 serves to prevent oxygen or moisture from infiltrating into the light emitting layer 342 and the cathode electrode 343. In such an embodiment, the thin film encapsulation layer 305 may include an inorganic film. In such an embodiment, the thin film encapsulation layer 305 may further include an organic film. The organic layer may have a sufficient thickness to prevent particles from passing through the thin film encapsulation layer 305 to infiltrate into the light emitting layer 342 and the cathode electrode 343.

The polarizing film PF may be disposed on the pixel array layer PAL. The polarizing film PF may prevent degradation in visibility due to reflection of external light. The polarizing film PF may be attached to a lower surface of the cover window 100 through an adhesive member (not shown). The adhesive member may include an optically cleared adhesive ("OCA") film or an optically cleared resin ("OCR"). In an embodiment, the polarizing film PF may include a linear polarizer and a phase retardation film such as a quarter-wave ($\lambda$/4) plate. In such an embodiment, the phase retardation film may be disposed on the display panel 300, and the linear polarizer may be disposed between the phase retardation film and the cover window 100.

The display circuit board 310 and the display drive circuit 320 may be attached to a surface of the display panel 300. An end portion of the display circuit board 310 may be attached to pads provided on surface of the display panel 300 using an anisotropic conductive film. The display circuit board 310 may be a flexible printed circuit board which is bendable.

The display drive circuit 320 receives control signals and power voltages through the display circuit board 310, and generates and outputs signals and voltages for driving the display panel 300. The display drive circuit 320 may be formed as an integrated circuit and attached to a protruding area PA of the display panel 300 through a chip on glass ("COG") method, a chip on plastic ("COP") method, or an ultrasonic method, but the disclosure is not limited thereto. In one embodiment, for example, the display drive circuit 320 may be attached to the display circuit board 310.

A touch drive circuit 330 may be disposed on the display circuit board 310. The touch drive circuit 330 may be formed as an integrated circuit and attached to an upper surface of the display circuit board 310. The touch drive circuit 330 may be connected to touch electrodes and touch lines of a touch sensor layer (not shown) of the display panel 300 through the display circuit board 310. In an embodiment where the touch sensor layer operates based on a mutual capacitance method, the touch drive circuit 330 may apply touch drive signals to drive electrodes among touch electrodes and detect charge variations in capacitance between the drive electrodes and sensing electrodes through the sensing electrodes among the touch electrodes, thereby sensing a touch.

A vibration drive circuit 340 may be disposed on the display circuit board 310. The vibration drive circuit 340 receives vibration data from a main processor 710. The vibration drive circuit 340 generates a first driving voltage and a second driving voltage based on the vibration data and outputs the first driving voltage and the second driving voltage to the sound generation device 510. The sound generation device 510 may output a sound by vibrating the display panel 300 in response to the first driving voltage and the second driving voltage.

The vibration drive circuit 340 may include a digital signal processor ("DSP") which processes the vibration data that is a digital signal, a digital-analog converter ("DAC") which converts digital data processed in the DSP into driving voltages that are analog signals, an amplifier ("AMP") which amplifies the driving voltages and outputs the amplified driving voltages, or the like.

The lower panel cover 400 may be disposed below the display panel 300. The lower panel cover 400 may be attached to a lower surface of the display panel 300 (e.g., the substrate SUB1) through an adhesive member (not shown). The adhesive member may be a pressure sensitive adhesive ("PSA"). The lower panel cover 400 may include a light absorbing member for absorbing incident light, a buffer member for absorbing an impact from the outside, or a heat dissipation member for efficiently dissipating heat of the display panel 300.

The light absorbing member may be disposed below the display panel 300 and may block light transmission to prevent components disposed below the light absorbing member, e.g., the display circuit board 310 and the sound generation device 510, when viewed from the top of the display panel 300 or a plan view in the thickness direction (i.e., the Z-axis direction) thereof. The light absorbing member may include a light absorbing material such as a black pigment, a black dye, or the like.

The buffer member is disposed below the light absorbing member and absorbs an external impact to prevent the display panel 300 from being damaged. The buffer member may be formed of a single layer or a multiple layer. In one embodiment, for example, the buffer member may include or be formed of a polymer resin such as polyurethane, polycarbonate or the like, or may include an elastic material such as rubber, a urethane-based material, or a sponge which is formed by foaming an acrylic-based material. The buffer member may be a cushion layer.

The heat dissipation member may be disposed below the buffer member and include a first heat dissipation layer having graphite, a carbon nanotube, and the like, and a second heat dissipation layer formed of a metal thin film such as Co, Ni, ferrite, or silver (Ag) which is capable of blocking electromagnetic waves and has excellent thermal conductivity.

The sound generation device 510 may be disposed below the lower panel cover 400. The sound generation device 510 may be attached to a lower surface of the lower panel cover 400 through an adhesive member (not shown). The adhesive member may be a PSA.

The sound generation device 510 may be a piezoelectric element or a piezoelectric actuator which vibrates the display panel 300 using a piezoelectric material that retracts or expands in response to an applied voltage.

The sound generation device 510 may be electrically connected to the vibration drive circuit 340, which drives the sound generation device 510, through a flexible circuit board 520. In an embodiment, as show in FIG. 3, the flexible circuit board 520 may be bent once, but a shape of the flexible circuit board 520 is not limited thereto. The flexible circuit board 520 may be a flexible printed circuit board which is bendable. The sound generation device 510 will be described below in greater detail.

In an embodiment, as shown in FIG. 3, the display circuit board 310 may be bent and disposed below the lower panel cover 400. The touch drive circuit 330 and the vibration drive circuit 340 may be disposed on a surface of the display circuit board 310, and a first connector 310a and a second connector 310b may be disposed on an opposing surface of the display circuit board 310. In such an embodiment, the opposing surface of the display circuit board 310 may be a surface facing the lower panel cover 400.

The first connector 310a may be connected to an end portion of a cable 314. In an embodiment, as shown in FIG. 4, another end portion of the cable 314 may be connected to a main connector 730 of the main circuit board 700, which is disposed below the bracket 610, through a cable hole CAH defined through the bracket 610.

The second connector 310b may be connected to an end portion of the flexible circuit board 520. A pad portion including pads electrically connected to the sound generation device 510 may be disposed on another end portion of the flexible circuit board 520.

The set cover 600 may be disposed below the display panel 300. The set cover 600 may include or be made of a plastic or a metal. The set cover 600 may include the bracket 610 and a lower cover 630.

In an embodiment, a first camera hole CMH1, the cable hole CAH, a battery hole BH, and an accommodation groove HA are defined in the bracket 610.

The first camera hole CMH1 may provide a space into which a camera device 750 is inserted. The cable hole CAH may provide a space through which the cable 314 connected to the display circuit board 310 is disposed. The battery hole BH may provide a space in which the battery is disposed.

In an embodiment, the first camera hole CMH1, the cable hole CAH, and the battery hole BH may be disposed to not overlap the sound generation device 510 in a thickness direction (a third direction Z) to prevent mechanical interference with the sound generation device 510.

The accommodation groove HA of the bracket 610 may provide a space in which the sound generation device 510 is accommodated. Further, the accommodation groove HA of the bracket 610 may provide a sound box space in which a vibration or a sound wave provided from the sound generation device 510 is amplified.

In an embodiment, as shown in FIG. 4, a plurality of slits 610S and a plurality of ribs 610R may be defined in the accommodation groove HA of the bracket 610. The ribs 610R may be disposed between the plurality of slits 610S. The plurality of ribs 610R may be divided by the slits 610S disposed therebetween. Further, the plurality of slits 610S may be divided by the ribs 610R disposed therebetween.

When viewed in a plan view, the plurality of slits 610S and the plurality of ribs 610R may extend in one direction and may be alternately disposed in another direction crossing the one direction. In an embodiment, as shown in FIG. 4, the plurality of slits 610S and the plurality of ribs 610R may extend in the first direction X and may be alternately disposed in the second direction Y crossing the first direction X.

The plurality of slits 610S may be defined through the bracket 610 in the thickness direction. In such an embodiment, portion of the bracket 610 is removed to define the slit 610S so that the sound box space, in which the vibration or the sound wave provided from the sound generation device 510 disposed in the accommodation groove HA is amplified, may be expanded. Therefore, acoustic performance of the display device 10 may be improved.

In such an embodiment, heat generated due to driving of the sound generation device 510 may be effectively discharged through the slit 610S, such that a heat dissipation characteristic of the display device 10 may be improved. Therefore, it is possible to prevent or minimize degradation in image quality of the display panel 300 due to heat generation of the sound generation device 510.

In an embodiment, as shown in FIGS. 5 and 6, the slit 610S may be defined through the bracket 610, but the disclosure is not limited thereto. In an embodiment, the plurality of ribs 610R may share a base and have a shape protruding from the base. In such an embodiment, the slit 610S may have a groove shape which is recessed from an upper surface of the rib 610R to an upper surface of the base.

In an embodiment, as described above, the bracket 610 includes the plurality of slits 610S and the plurality of ribs 610R, such that elasticity of the bracket 610 may be increased. In such an embodiment, even when the display panel 300 is deformed due to an external impact applied to the display device 10, and the sound generation device 510 disposed below the display panel 300 thereby collides with the bracket 610, an impact applied to the sound generation device 510 may be alleviated due to the elasticity of the plurality of slits 610S and the plurality of ribs 610R. In such an embodiment, damage to the display device 10 due to an external impact may be effectively prevented or substantially minimized. The slit 610S and the rib 610R will be described below in greater detail.

The lower cover 630 may be disposed below the bracket 610. The lower cover 630 may be engaged with and fixed to the bracket 610. The lower cover 630 may include a plastic and/or a metal. In an embodiment, the plurality of ribs 610R may be spaced apart from the lower cover 630. Alternatively, the plurality of ribs 610R may be attached to the lower cover 630.

A second camera hole CMH2 into which the camera device 750 is inserted to protrude to the outside may be defined or formed in the lower cover 630. A position of the camera device 750 and positions of the first and second camera holes CMH1 and CMH2 corresponding to the camera device 750 are not limited to the positions shown in FIG. 2.

The main circuit board 700 may be disposed between the bracket 610 and the lower cover 630. The main circuit board 700 may be a printed circuit board or a flexible printed circuit board.

The main circuit board 700 may include the main processor 710, the camera device 750, the main connector 730, and a microphone (not shown). The camera device 750 may be disposed on both upper and lower surfaces of the main circuit board 700, the main processor 710 may be disposed on the upper surface of the main circuit board 700, and the main connector 730 may be disposed on the lower surface of the main circuit board 700.

The main processor 710 may output digital video data to the display drive circuit 320 through the display circuit board 310 so that the display panel 300 displays an image. In an embodiment, the main processor 710 may output vibration data to the vibration drive circuit 340 which drives the sound generation device 510 to vibrate the display panel 300 through the sound generation device 510 to output a sound.

The camera device 750 processes an image frame such as a still image or a moving image, which is obtained by an image sensor in a camera mode, and outputs the processed image frame to the main processor 710.

The main connector 730 may be connected to the cable 314 disposed through the cable hole CAH of the bracket 610. Thus, the main circuit board 700 may be electrically connected to the display circuit board 310 and the touch circuit board 210.

In accordance with an embodiment of the display device 10, an external impact applied to the display panel 300 or the sound generation device 510 may be alleviated by arranging the plurality of slits 610S and the plurality of ribs 610R in the bracket 610 of the set cover 600. In such an embodiment, damage to the display device 10 due to an external impact may be effectively prevented.

In such an embodiment, since the sound box space in which a vibration or a sound wave provided from the sound generation device 510 is amplified may be expanded through the slits 610S, acoustic performance of the display device 10 may be improved.

In such an embodiment, heat generated due to driving of the sound generation device 510 may be effectively discharged through the slits 610S, and thus a heat dissipation characteristic of the display device 10 may be improved. Therefore, it is possible to prevent or minimize degradation in image quality of the display panel 300 due to heat generation of the sound generation device 510. Hereinafter, the slit 610S and the rib 610R will be described in greater detail.

Referring to FIG. 6, the rib 610R may be disposed between the sound generation device 510 and the lower cover 630, and may be disposed to be spaced apart from the sound generation device 510 and the lower cover 630.

In an embodiment, a thickness of the rib 610R may be smaller than an average thickness of the bracket 610. Here, the thickness of the rib 610R may be defined as a shortest distance from an upper surface to a lower surface of the rib 610R. The upper surface of the rib 610R may be a surface facing the sound generation device 510, and the lower surface of the rib 610R may be a surface facing the lower cover 630. As the thickness of the rib 610R is formed to be relatively small, elasticity of an area in which the rib 610R is disposed may be partially increased, such that damage to the sound generation device 510 due to an external impact may be prevented more effectively.

In an embodiment, the plurality of ribs 610R may be disposed at regular intervals. Widths 610W of the plurality of ribs 610R may be substantially the same as each other. Here, the width 610W of the rib 610R may mean a width in the second direction Y.

In an embodiment, the plurality of slits 610S may be disposed at regular intervals. In such an embodiment, widths 610D of the plurality of slits 610S may be substantially the same as each other. Here, the width 610D of the slit 610S may mean a width in the second direction Y.

In an embodiment, the width 610W of the rib 610R may be different from the width 610D of the slit 610S. In one embodiment, for example, the width 610W of the rib 610R may be smaller than the width 610D of the slit 610S. In such an embodiment, as an area of the slit 610R increases, elasticity of the bracket 610 may be increased, such that damage to the sound generation device 510 due to an external impact may be prevented more effectively.

A first side surface and a second side surface of the rib 610R may be located between the upper surface and the lower surface of the rib 610R. The first side surface and the second side surface of the rib 610R may be perpendicular to the upper surface and/or the lower surface of the rib 610R. Hereinafter, the sound generation device 510 will be described in detail.

Figure 8:
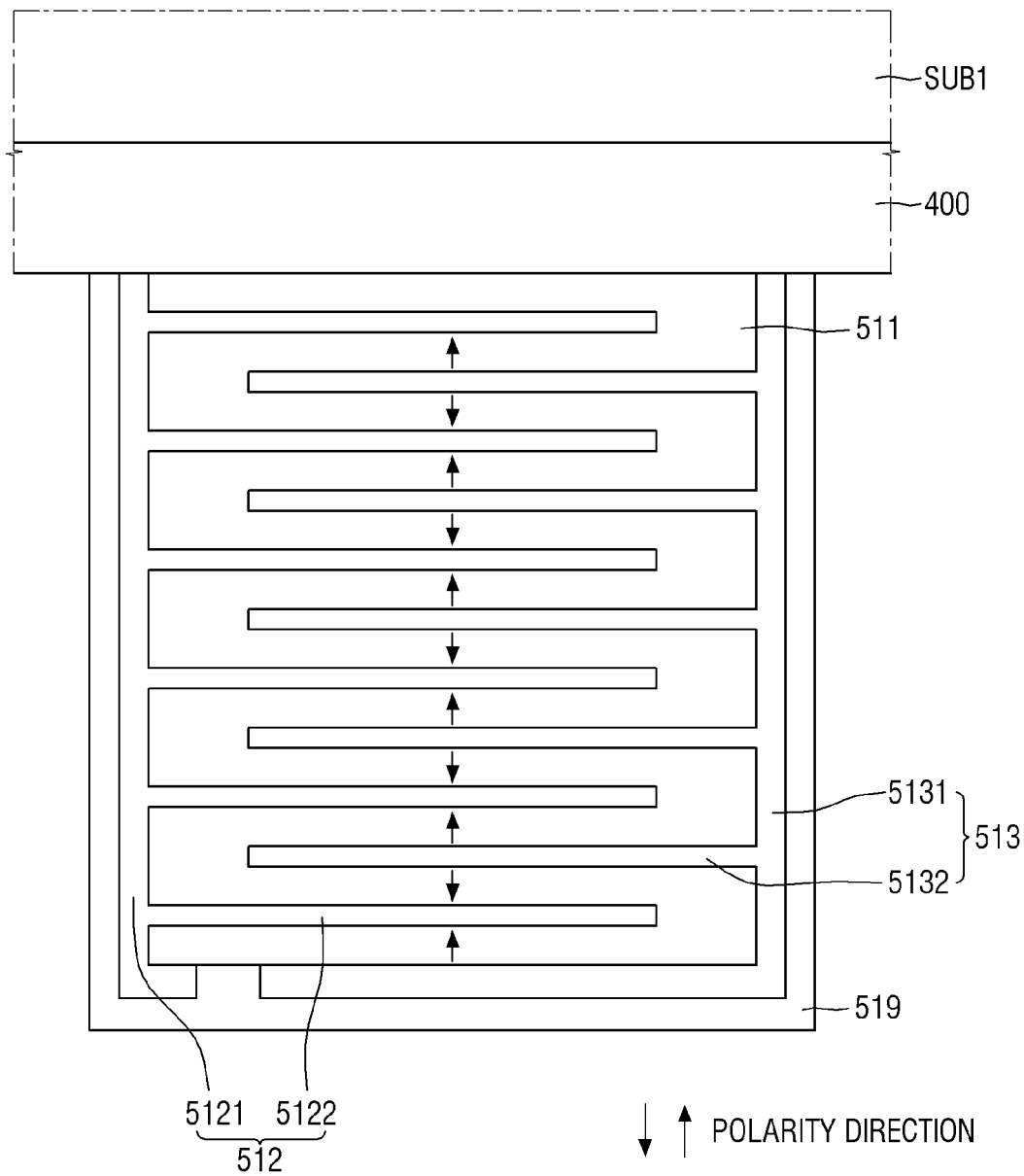
FIG. 8 is a cross-sectional view of a sound generation device according to an embodiment.
Figure 9:
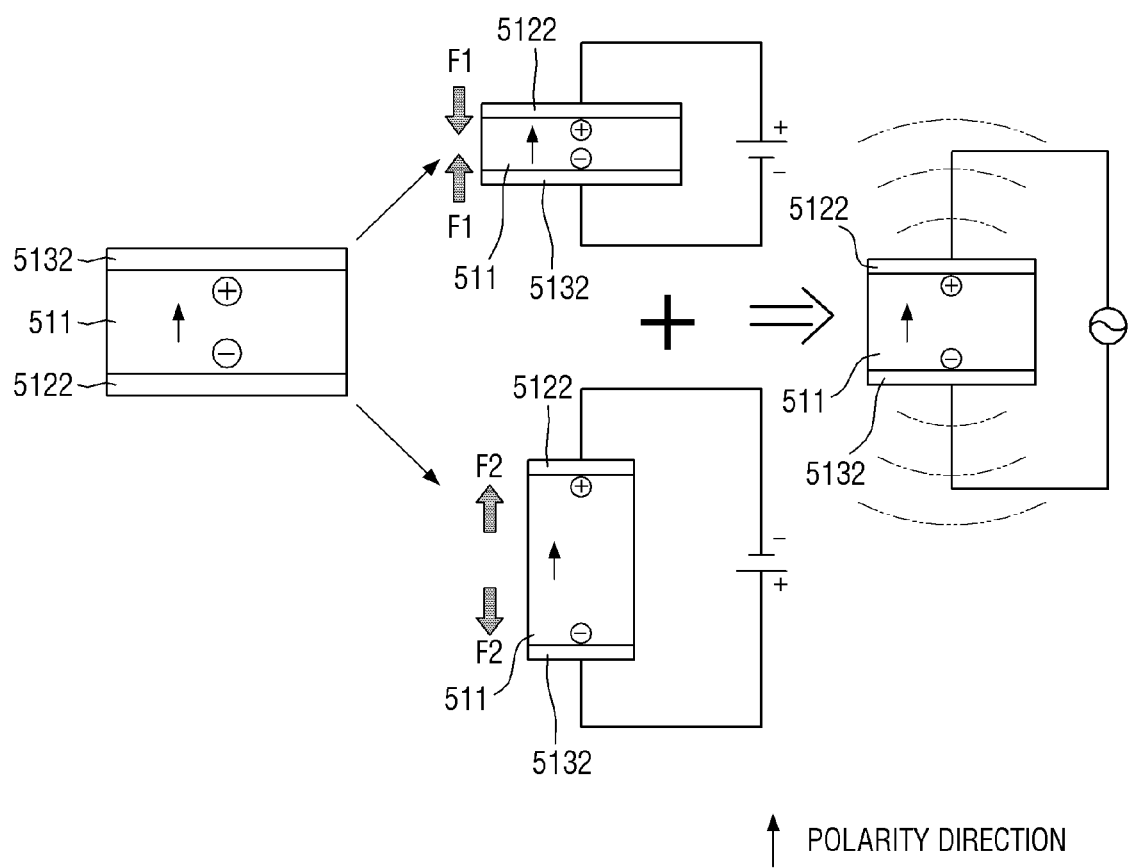
FIG. 9 is a schematic diagram for describing a vibration method of a vibration layer disposed between a first branch electrode and a second branch electrode of the sound generation device.
Figure 10:
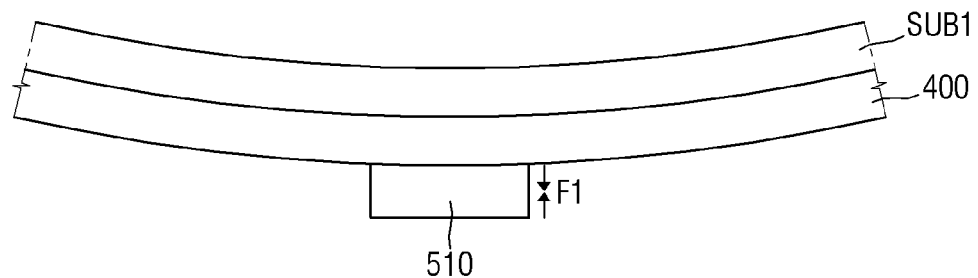
FIGS. 10 and 11 are schematic diagrams for describing the vibration method of the display panel due to a vibration of the sound generation device.
Figure 11:
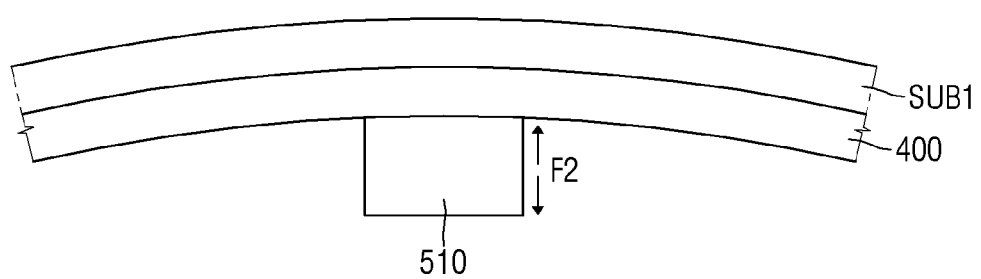

FIG. 8 is a cross-sectional view of a sound generation device according to one embodiment. FIG. 9 is a schematic diagram for describing a vibration method of a vibration layer disposed between a first branch electrode and a second branch electrode of the sound generation device. FIGS. 10 and 11 are schematic diagrams for describing the vibration method of the display panel due to a vibration of the sound generation device.

Referring to FIGS. 8 to 11, the sound generation device 510 may be a piezoelectric element or a piezoelectric actuator which vibrates the display panel 300 using a piezoelectric material that retracts or expands according to an applied voltage. The sound generation device 510 may include a vibration layer 511, a first electrode 512, and a second electrode 513. For convenience of description, the flexible circuit board 520 is omitted in FIGS. 8 to 11. In an embodiment, a protection layer 519 may be additionally disposed on a second surface and side surfaces of the sound generation device 510.

The first electrode 512 may include a first stem electrode 5121 and first branch electrodes 5122. In an embodiment, as shown in FIG. 8, the first stem electrode 5121 may be disposed on at least one side of the vibration layer 511. Alternatively, the first stem electrode 5121 may be disposed through a portion of the vibration layer 511. Also, alternatively, the first stem electrode 5121 may be disposed on an upper surface of the vibration layer 511. The first branch electrodes 5122 may branch from the first stem electrode 5121. The first branch electrodes 5122 may be disposed in parallel to each other.

The second electrode 513 may include a second stem electrode 5131 and second branch electrodes 5132. The second electrode 513 may be disposed to be spaced apart from the first electrode 512, such that the second electrode 513 may be electrically separated from the first electrode 512. The second stem electrode 5131 may be disposed on at least one side of the vibration layer 511. In an embodiment, the first stem electrode 5121 may be disposed on a first side surface of the vibration layer 511, and the second stem electrode 5131 may be disposed on a second side surface of the vibration layer 511. Alternatively, the second stem electrode 5131 may be disposed through a portion of the vibration layer 511. Also, alternatively, the second stem electrode 5131 may be disposed on the upper surface of the vibration layer 511. The second branch electrodes 5132 may branch from the second stem electrode 5131. The second branch electrodes 5132 may be disposed in parallel to each other.

In an embodiment, the first branch electrodes 5122 may be disposed in parallel to the second branch electrodes 5132 in a lateral direction (the X-axis direction or the Y-axis direction). In such an embodiment, the first branch electrodes 5122 and the second branch electrodes 5132 may be alternately disposed in a vertical direction (the Z-axis direction). In such an embodiment, the first branch electrodes 5122 and the second branch electrodes 5132 may be repeatedly disposed in the vertical direction (the Z-axis direction) in the order of the first branch electrode 5122, the second branch electrode 5132, the first branch electrode 5122, and the second branch electrode 5132.

The first electrode 512 and the second electrode 513 may be connected to pads of the flexible circuit board 520. The pads of the flexible circuit board 520 may be connected to the first electrode 512 and the second electrode 513 which are disposed on a surface of the sound generation device 510.

The vibration layer 511 may be a piezoelectric element which is deformed according to a driving voltage applied to the first electrode 512 and a driving voltage applied to the second electrode 513. In this case, the vibration layer 511 may include or be made of any one of a piezoelectric material, such as a poly vinylidene fluoride ("PVDF") film or a plumbium ziconate titanate ("PZT"), and an electro active polymer.

Since a manufacturing temperature of the vibration layer 511 is high, the first electrode 512 and the second electrode 513 may be formed of Ag or an alloy of Ag and palladium (Pd), which has a high melting point. In an embodiment, where the first electrode 512 and the second electrode 513 are each formed of an alloy of Ag and Pd to increase the melting points of the first electrode 512 and the second electrode 513, a content of Ag may be greater than that of Pd.

The vibration layer 511 may be disposed between the first branch electrodes 5122 and the second branch electrodes 5132. The vibration layer 511 retracts or expands according to a difference between a driving voltage applied to the first branch electrode 5122 and a driving voltage applied to the second branch electrode 5132.

In an embodiment, as shown in FIG. 9, when a polarity direction of the vibration layer 511 disposed between the first branch electrode 5122 and the second branch electrode 5132, which is disposed below the first branch electrode 5122, is an upward direction (↑), the vibration layer 511 may have positive polarity in an upper area adjacent to the first branch electrode 5122 and have negative polarity in a lower area adjacent to the second branch electrode 5132. Further, when the polarity direction of the vibration layer 511 disposed between the second branch electrode 5132 and the first branch electrode 5122, which is disposed below the second branch electrode 5132, is a downward direction (↓), the vibration layer 511 may have negative polarity in an upper area adjacent to the second branch electrode 5132 and have positive polarity in a lower area adjacent to the first branch electrode 5122. The polarity direction of the vibration layer 511 may be determined by a poling process of applying an electric field to the vibration layer 511 using the first branch electrode 5122 and the second branch electrode 5132.

When the polarity direction of the vibration layer 511 disposed between the first branch electrode 5122 and the second branch electrode 5132, which is disposed below the first branch electrode 5122, is the upward direction (↑), a positive driving voltage is applied to the first branch electrode 5122, and a negative driving voltage is applied to the second branch electrode 5132, the vibration layer 511 may retract due to a first force F1. The first force F1 may be a retractive force. Further, when a negative driving voltage is applied to the first branch electrode 5122 and a positive driving voltage is applied to the second branch electrode 5132, the vibration layer 511 may expand according to a second force F2. The second force F2 may be a stretching force.

Similarly, when the polarity direction of the vibration layer 511 disposed between the second branch electrode 5132 and the first branch electrode 5122, which is disposed below the second branch electrode 5132, is the downward direction (↓), a positive driving voltage is applied to the second branch electrode 5132, and a negative driving voltage is applied to the first branch electrode 5122, the vibration layer 511 may expand according to the stretching force. Further, when a negative driving voltage is applied to the second branch electrode 5132 and a positive driving voltage is applied to the first branch electrode 5122, the vibration layer 511 may retract according to the retractive force.

In an embodiment, when the driving voltage applied to the first electrode 512 and the driving voltage applied to the second electrode 513 are alternately repeated with positive polarity and negative polarity, the vibration layer 511 repeatedly retracts and expands as shown in FIGS. 10 and 11. Consequently, the sound generation device 510 is vibrated. In an embodiment where the sound generation device 510 is disposed on a surface of a heat dissipation film 130, when the vibration layer 511 of the sound generation device 510 retracts and expands, as shown in FIGS. 10 and 11, the display panel 300 vibrates due to stress in the third direction (the Z-axis direction) which is a thickness direction of the display panel 300.

In accordance with an embodiment of the display device 10, the bracket 610 of the set cover 600 includes the plurality of slits 610S and the plurality of ribs 610R, such that elasticity of the bracket 610 may be increased. In such an embodiment, even when the display panel 300 is deformed due to an external impact applied to the display device 10 so that the sound generation device 510 disposed below the display panel 300 collides with the bracket 610, an impact applied to the sound generation device 510 may be alleviated due to elasticity of the plurality of slits 610S and the plurality of ribs 610R. Accordingly, damage to the display device 10 due to an external impact may be effectively prevented or substantially minimized.

In such an embodiment, the sound box space in which a vibration or a sound wave provided from the sound generation device 510 is amplified may be expanded through the slits 610S, such that acoustic performance of the display device 10 may be improved.

In such an embodiment, heat generated due to driving of the sound generation device 510 may be effectively discharged through the slits 610S, such that a heat dissipation characteristic of the display device 10 may be improved. Therefore, it is possible to prevent or minimize degradation in image quality of the display panel 300 due to heat generation of the sound generation device 510.

Hereinafter, alternative embodiments will be described. In the following embodiments, the same or like reference numerals will be assigned to the same or like components as those described above, and any repetitive detailed descriptions thereof will be omitted or simplified.

Figure 12:
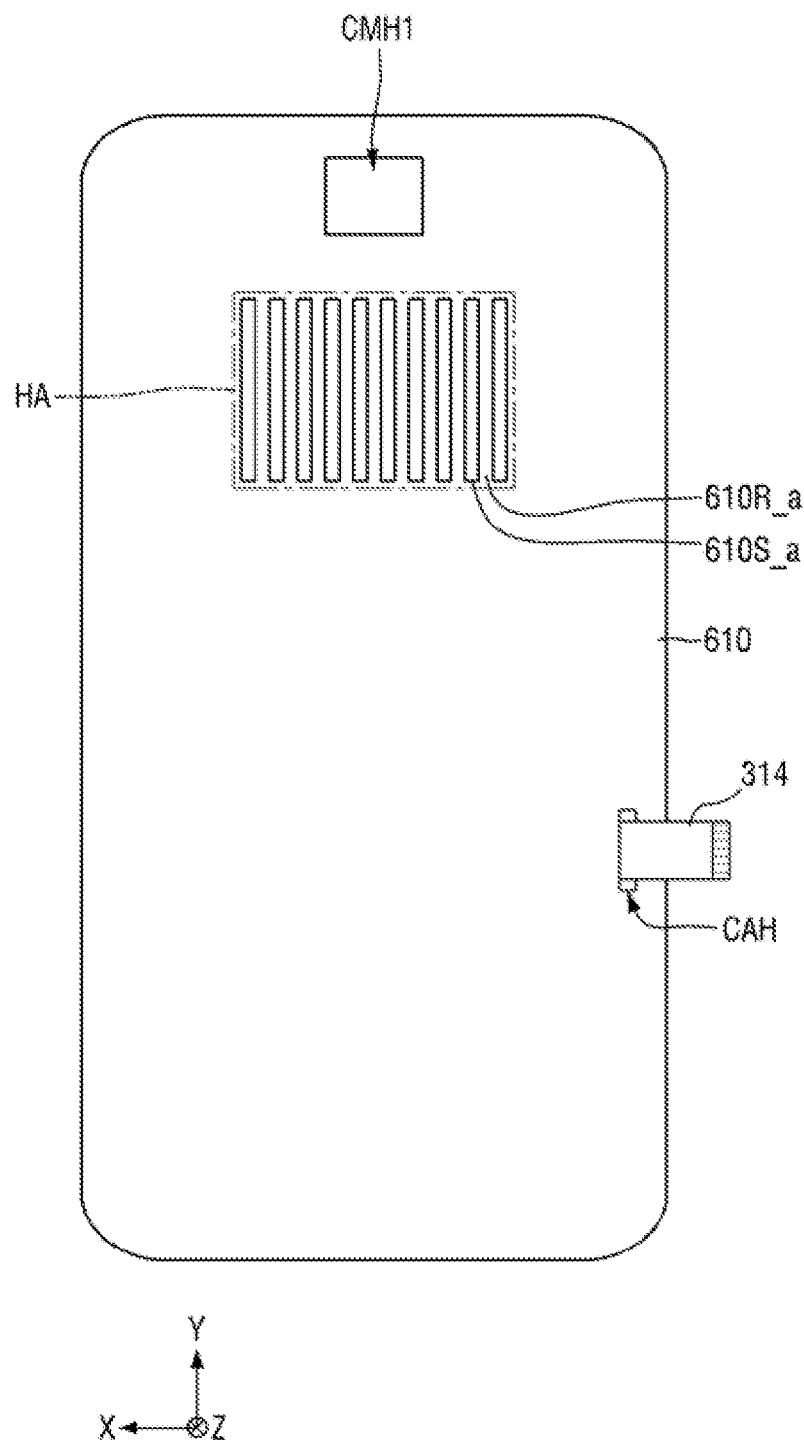
FIG. 12 is a bottom view of a bracket according to an alternative embodiment.

FIG. 12 is a bottom view of a bracket according to an alternative embodiment.

Referring to FIG. 12, in such an embodiment, a plurality of slits 610S_a and a plurality of ribs 610R_a are substantially the same as those of the embodiments described above with reference to FIGS. 1 to 11 except that the plurality of slits 610S_a and the plurality of ribs 610R_a extend in the second direction Y.

In such an embodiment, the plurality of slits 610S_a and the plurality of ribs 610R_a may extend in the second direction Y and may be alternately disposed in the first direction X.

In such an embodiment, other features of the slit 610S_a and the rib 610R_a may be substantially the same as or similar to those of the slit 610S and the rib 610R described above with reference to FIGS. 1 to 11, and any repetitive detailed descriptions thereof will be omitted.

Figure 13:
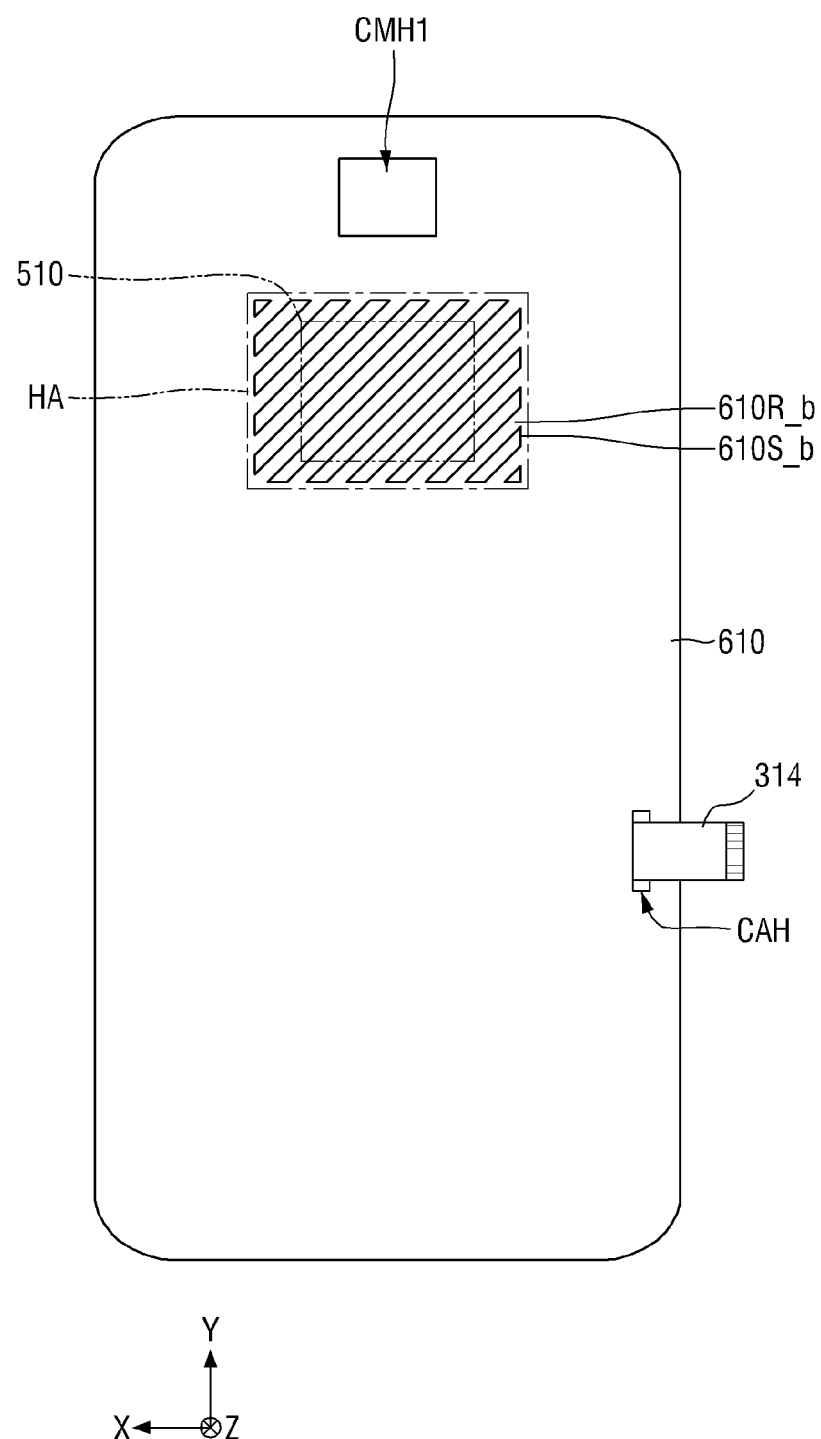
FIG. 13 is a bottom view of a bracket according to another alternative embodiment.

FIG. 13 is a bottom view of a bracket according to another alternative embodiment.

Referring to FIG. 13, in such an embodiment, a plurality of slits 610S_b and a plurality of ribs 610R_b are substantially the same as those of the embodiments described above with reference to FIGS. 1 to 11 except that, when viewed in a plan view, the plurality of slits 610S_b and the plurality of ribs 610R_b extend in one direction which is inclined with respect to the first direction X at a predetermined angle.

In such an embodiment, when viewed in a plan view, the plurality of slits 610S_b and the plurality of ribs 610R_b may extend in one direction which is inclined with respect to the first direction X at a predetermined angle and may be alternately disposed in another direction crossing the one direction. In such an embodiment, the plurality of slits 610S_b and the plurality of ribs 610R_b may be alternately disposed in a first diagonal direction between the first direction X and the second direction Y and may extend in a second diagonal direction crossing the first diagonal direction.

In such an embodiment, other features of the slit 610S_b and the rib 610R_b may be substantially the same as or similar to those of the slit 610S and the rib 610R described above with reference to FIGS. 1 to 11, and any repetitive detailed descriptions thereof will be omitted herein.

Figure 14:
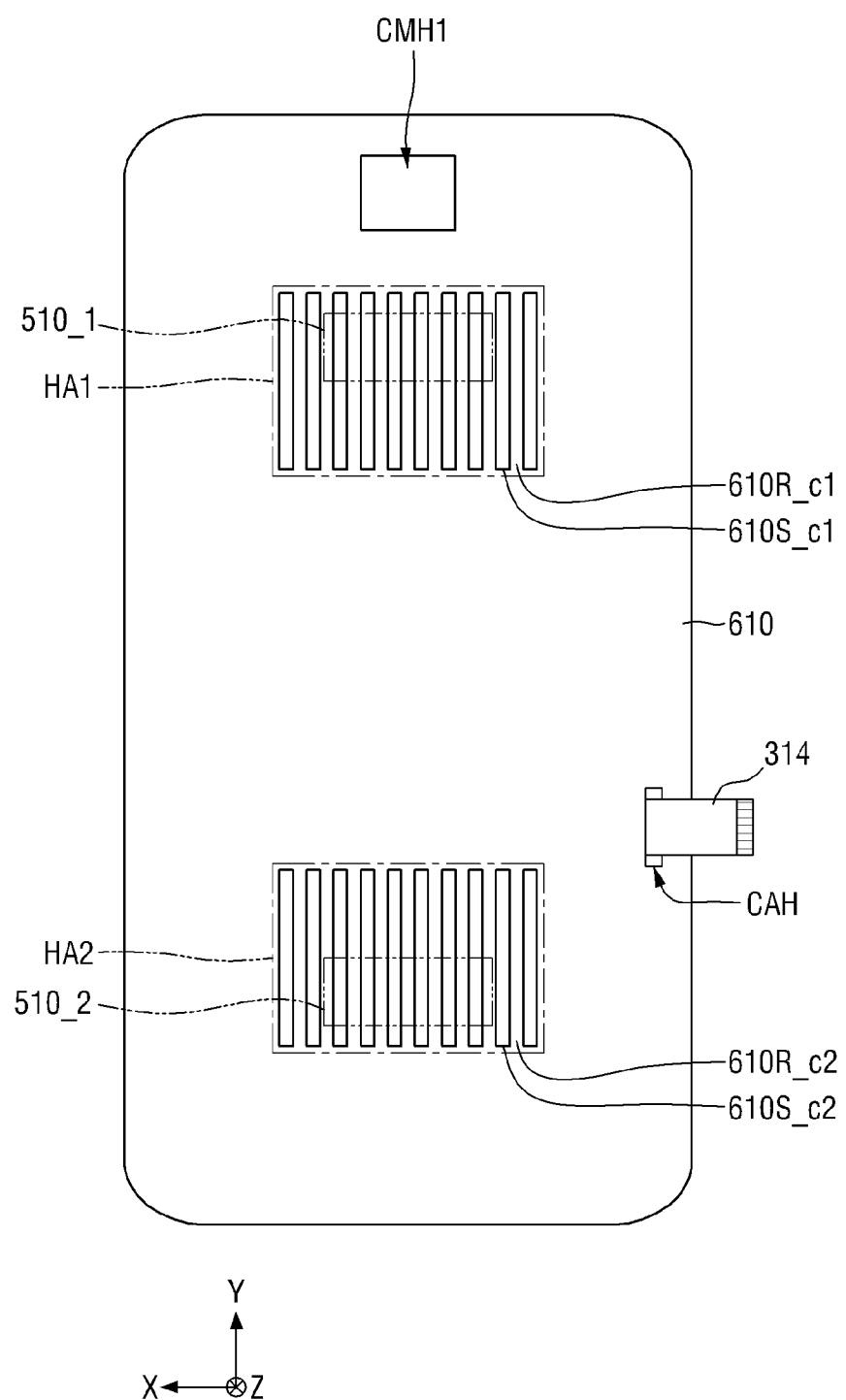
FIG. 14 is a bottom view of a bracket according to still another alternative embodiment.

FIG. 14 is a bottom view of a bracket according to yet another alternative embodiment.

Referring to FIG. 14, a display device including the bracket is substantially the same as the embodiments of the display device described above with reference to FIGS. 1 to 11 except that the display device includes a plurality of sound generation devices 510_1 and 510_2.

In such an embodiment, the display device may include a first sound generation device 510_1 and a second sound generation device 510_2 which are spaced apart from each other.

The first sound generation device 510_1 may be accommodated in a first accommodation groove HA1 and the second sound generation device 510_2 may be accommodated in a second accommodation groove HA2.

A plurality of first slits 610S_c1 and a plurality of first ribs 610R_c1 may be disposed or defined in the first accommodation groove HA1. When viewed in a plan view, the plurality of first slits 610S_c1 and the plurality of first ribs 610R_c1 may extend in one direction and may be alternately disposed in another direction crossing the one direction. In one embodiment, for example, the plurality of first slits 610S_c1 and the plurality of first ribs 610R_c1 may extend in the first direction X and may be alternately disposed in the second direction Y crossing the first direction X.

A plurality of second slits 610S_c2 and a plurality of second ribs 610R_c2 may be disposed or defined in the second accommodation groove HA2. The plurality of second slits 610S_c2 and the plurality of second ribs 610R_c2 may extend in a direction that is the same as the direction in which the plurality of first slits 610S_c1 and the plurality of first ribs 610R_c1 extend. In one embodiment, for example, the plurality of second slits 610S_c2 and the plurality of second ribs 610R_c2 may extend in the first direction X and may be alternately disposed in the second direction Y crossing the first direction X.

The first accommodation groove HA' and the second accommodation groove HA2 may be disposed to be spaced apart from each other. Accordingly, one end portions of the plurality of first slits 610S_c1 may be spaced apart from those of the plurality of second slits 610S_c2, and one end portions of the plurality of first ribs 610R_c1 may be spaced apart from those of the plurality of second ribs 610R_c2. In such an embodiment, a vibration generated from the first sound generation device 510_1 may be effectively prevented from being transmitted to the second sound generation device 510_2. Similarly, a vibration generated from the second sound generation device 510_2 may be prevented from affecting the first sound generation device 510_1. Accordingly, the first sound generation device 510_1 outputs a first sound, and the second sound generation device 510_2 outputs a second sound such that a channel effect may be realized.

In such an embodiment, other features of the first slit 610S_c1, the second slit 610S_c2, the first rib 610R_c1, and the second rib 610R_c2 may be substantially the same as or similar to those of the slit 610S and the rib 610R described above with reference to FIGS. 1 to 11, and any repetitive detailed description thereof will be omitted herein.

Figure 15:
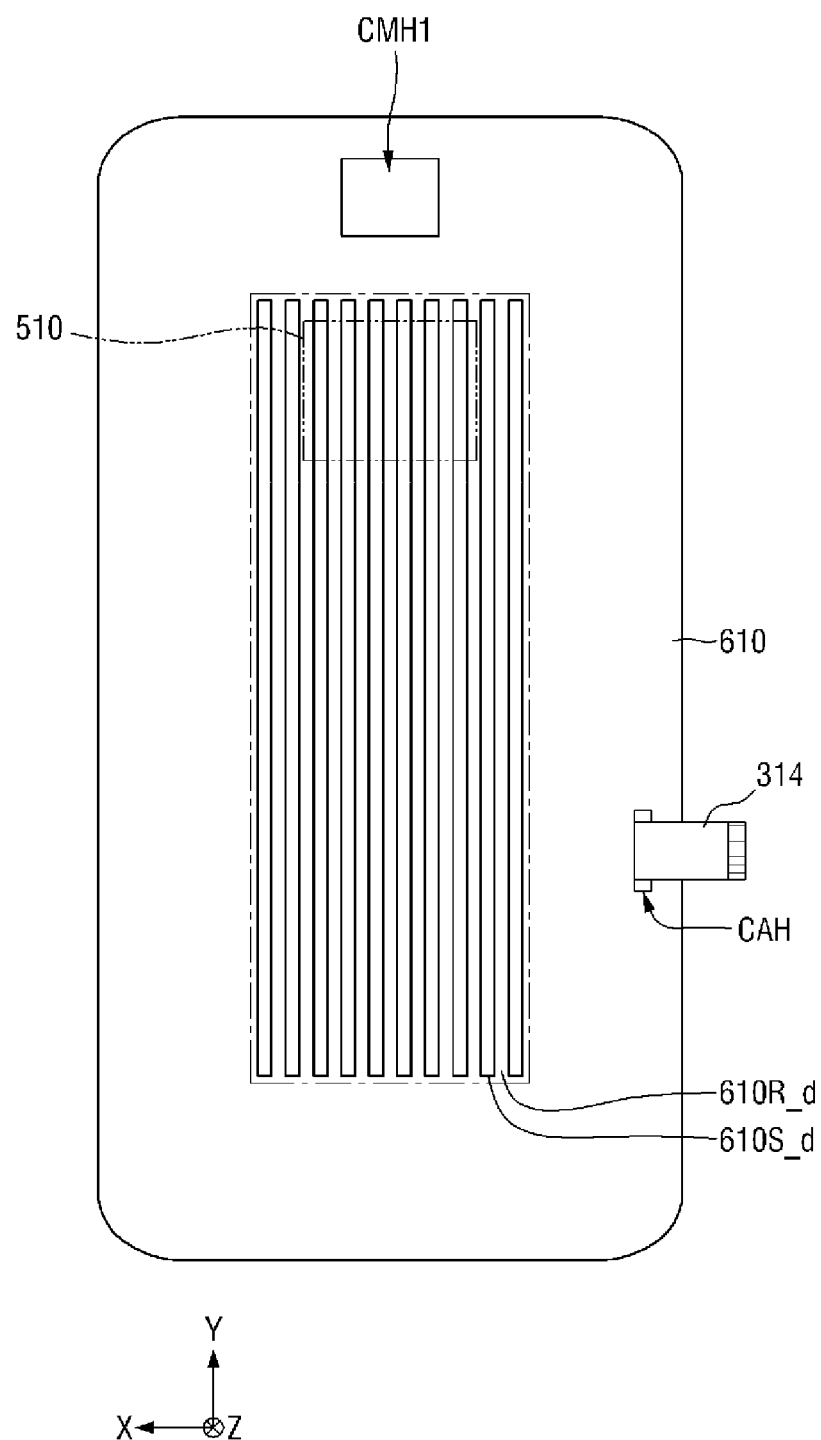
FIG. 15 is a bottom view of a bracket according to yet another alternative embodiment.

FIG. 15 is a bottom view of a bracket according to yet another alternative embodiment.

Referring to FIG. 15, in such an embodiment, a plurality of slits 610S_d and a plurality of ribs 610R_d are substantially the same as those of the embodiments described above with reference to FIGS. 1 to 11 except that the plurality of slits 610S_d and a plurality of ribs 610R_d extend to be adjacent to a lower portion of a bracket 610.

In such an embodiment, the plurality of slits 610S_d and the plurality of ribs 610R_d may extend in the second direction Y and may be alternately disposed in the first direction X. In such an embodiment, the plurality of slits 610S_d and the plurality of ribs 610R_d may extend to be adjacent to the lower portion of the bracket 610 in a direction opposite the second direction Y. In such an embodiment, even when a sound generation device 510 is disposed on one side of the bracket 610, the plurality of slits 610S_d and the plurality of ribs 610R_d are uniformly formed on an entirety of a surface of the bracket 610, such that uniformity of a sound which is output from the display device may be improved.

An area in which the sound generation device 510 overlaps the plurality of slits 610S_d and the plurality of ribs 610R_d may be smaller than that in which the sound generation device 510 does not overlap the plurality of slits 610S_d and the plurality of ribs 610R_d.

In such an embodiment, other features of the slit 610S_d and the rib 610R_d may be substantially the same as or similar to those of the slit 610S and the rib 610R described above with reference to FIGS. 1 to 11, and any repetitive detailed description thereof will be omitted herein.

Figure 16:
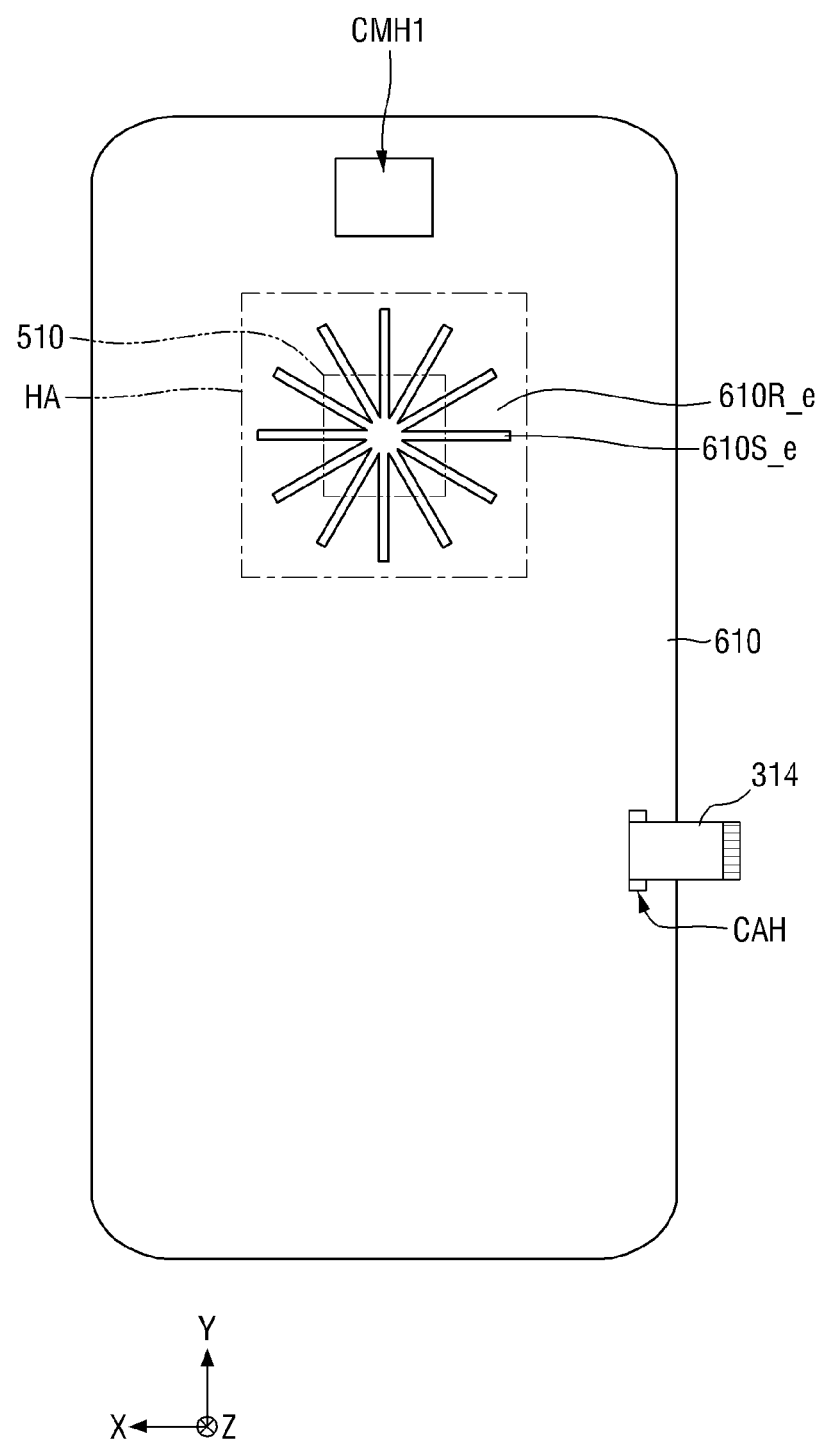
FIG. 16 is a bottom view of a bracket according to yet another alternative embodiment

FIG. 16 is a bottom view of a bracket according to yet another alternative embodiment.

Referring to FIG. 16, in such an embodiment, a plurality of slits 610S_e and a plurality of ribs 610R_e are substantially the same as those of the embodiments described above with reference to FIGS. 1 to 11 except that the plurality of slits 610S_e and the plurality of ribs 610R_e have a radial structure.

In such an embodiment, the plurality of slits 610S_e may radially extend with respect to a sound generation device 510. The plurality of slits 610S_e may be symmetrical with respect to the sound generation device 510. The plurality of slits 610S_e may extend with a same length as each other.

In such an embodiment, where the plurality of slits 610S_e has a radial structure, a vibration or a sound which is generated from the sound generation device 510 may be uniformly output. Therefore, uniformity of the sound which is output from the display device may be improved.

In such an embodiment, other features of the slit 610S_e and the rib 610R_e may be substantially the same as or similar to those of the slit 610S and the rib 610R described above with reference to FIGS. 1 to 11, and any repetitive detailed description thereof will be omitted herein.

Figure 17:
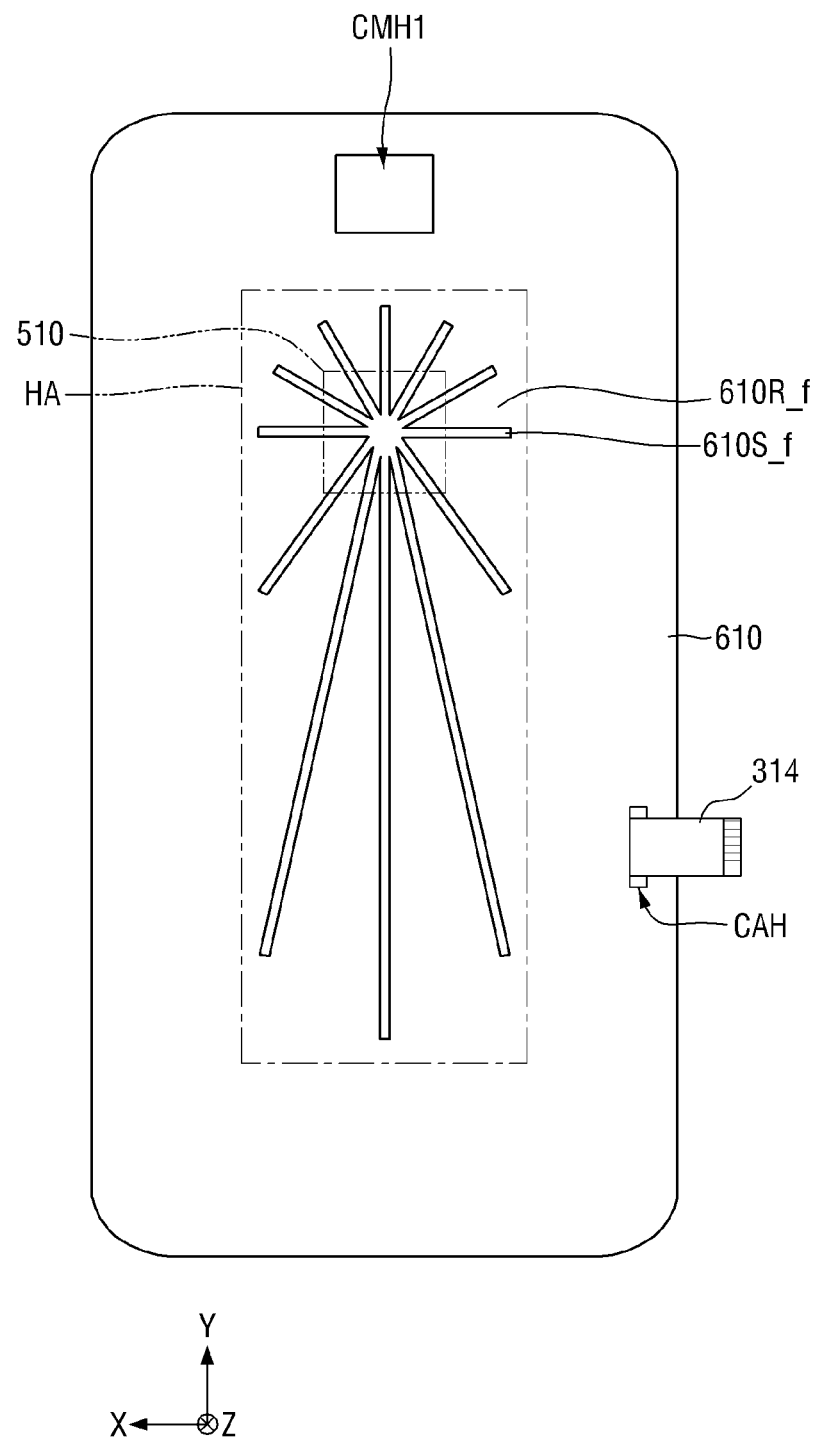
FIG. 17 is a bottom view of a bracket according to yet alternative another embodiment.

FIG. 17 is a bottom view of a bracket according to yet another alternative embodiment.

Referring to FIG. 17, in such an embodiment, a plurality of slits 610S_f and a plurality of ribs 610R_f are substantially the same as those of the embodiment of FIG. 16 except that the plurality of slits 610S_f and the plurality of ribs 610R_f have a radial structure and are asymmetrically disposed with respect to a sound generation device 510.

In such an embodiment, lengths of the slits 610S_f extending to one side about the sound generation device 510 may be different from those of the slits 610S_f extending to another side with respect thereto. In one embodiment, for example, the length of the slit 610S_f extending in the second direction Y with respect to the sound generation device 510 may be smaller than that of the slit 610S_f extending in a direction opposite the second direction Y.

The slits 610S_f, which extend in the direction opposite the second direction Y with respect to the sound generation device 510, may extend to be adjacent to a lower portion of a bracket 610. In such an embodiment, even when the sound generation device 510 is disposed on one side of the bracket 610, the radial-shaped slits 610S_f are formed on an entirety of a surface of the bracket 610, such that uniformity of a sound which is output from the display device may be improved.

In such an embodiment, other features of the slit 610S_f and the rib 610R_f may be substantially the same as or similar to those of the slit 610S and the rib 610R described above with reference to FIGS. 1 to 11, and any repetitive detailed description thereof will be omitted herein.

Figure 18:
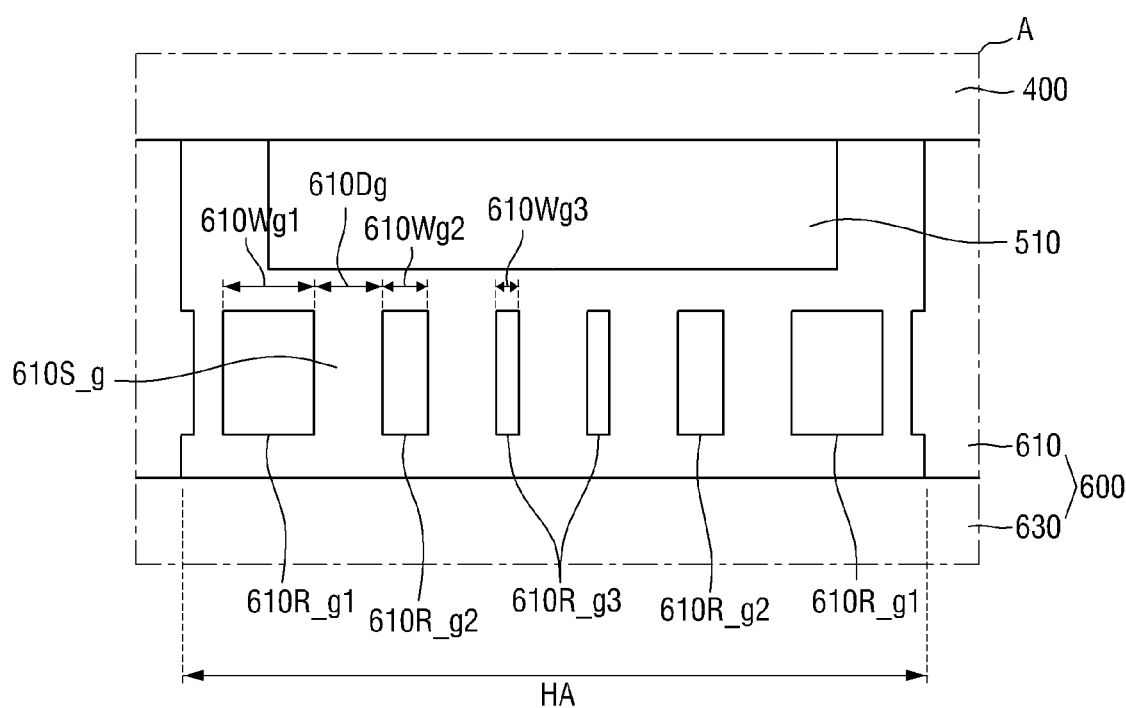
FIG. 18 is an enlarged cross-sectional view of a display device according to an alternative embodiment.

FIG. 18 is an enlarged cross-sectional view of a display device according to yet another alternative embodiment.

Referring to FIG. 18, in such an embodiment, a plurality of ribs 610R_g1, 610R_g2, and 610R_g3 are substantially the same as those of the embodiments described above with reference to FIGS. 1 to 11 except that the plurality of ribs 610R_g1, 610R_g2, and 610R_g3 have widths decreasing as being toward a center of an accommodation groove HA.

In such an embodiment, the plurality of ribs 610R_g1, 610R_g2, and 610R_g3 may include a first rib 610R_g1, a second rib 610R_g2, and a third rib 610R_g3 which have different widths from each other.

In an embodiment, as shown in FIG. 18, a width 610Wg1 of the first rib 610R_g1 may be greater than a width 610Wg2 of the second rib 610R_g2, and a width 610Wg2 of the second rib 610R_g2 may be greater than a width 610Wg3 of the third rib 610R_g3.

The first rib 610R_g1 may be disposed at an outermost side in the accommodation groove HA. The third rib 610R_g3 may be disposed in a center of the accommodation groove HA. The second rib 610R_g2 may be disposed between the first rib 610R_g1 and the third rib 610R_g3.

A plurality of slits 610S_g may be defined between the first rib 610R_g1 and the second rib 610R_g2 and between the second rib 610R_g2 and the third rib 610R_g3. The plurality of slits 610S_g may have a same width 610Dg as each other. In such an embodiment, the first rib 610R_g1, the second rib 610R_g2, and the third rib 610R_g3 may be disposed at regular intervals.

In such an embodiment, other features of the plurality of slits 610S_g and the plurality of ribs 610R_g1, 610R_g2, and 610R_g3 may be substantially the same as or similar to those of the slit 610S and the rib 610R described above with reference to FIGS. 1 to 11, and any repetitive detailed description thereof will be omitted herein.

Figure 19:
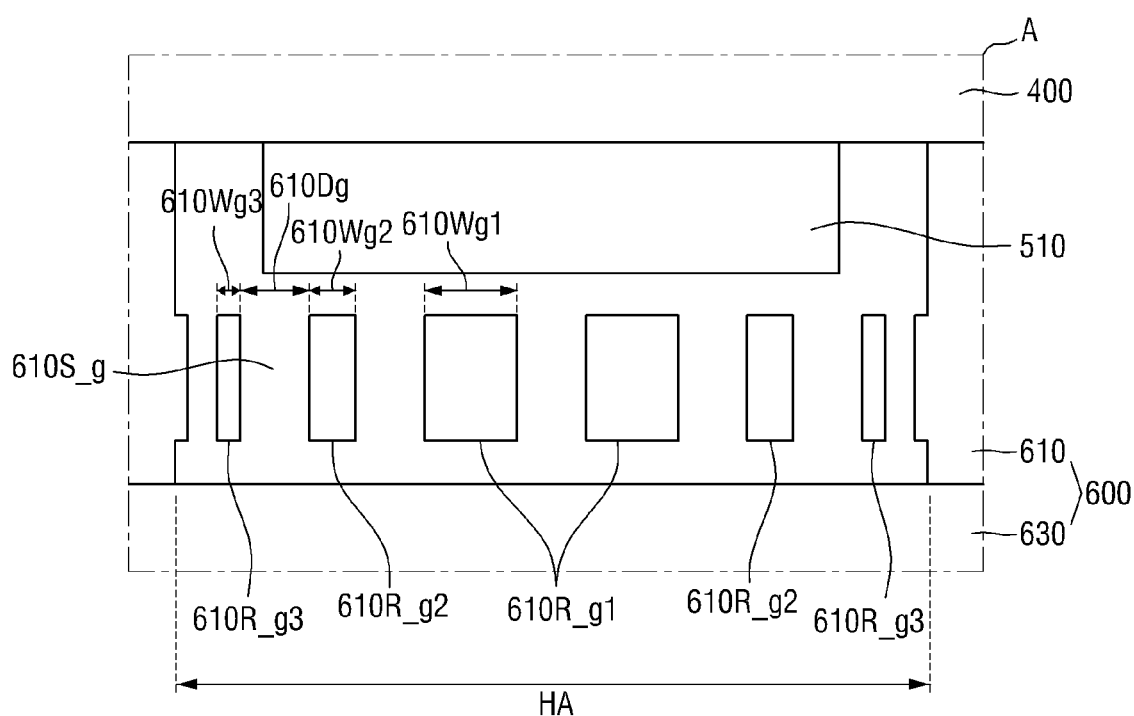
FIG. 19 is an enlarged cross-sectional view of a display device according to another alternative embodiment.

FIG. 19 is an enlarged cross-sectional view of a display device according to yet another alternative embodiment.

Referring to FIG. 19, in such an embodiment, a plurality of ribs 610R_g1, 610R_g2, and 610R_g3 are substantially the same as those of the embodiment of FIG. 18 except that the plurality of ribs 610R_g1, 610R_g2, and 610R_g3 have widths increasing in a direction of a center of an accommodation groove HA.

In such an embodiment, the plurality of ribs 610R_g1, 610R_g2, and 610R_g3 may include a first rib 610R_g1, a second rib 610R_g2, and a third rib 610R_g3 which have different widths from each other.

In such an embodiment, as shown in FIG. 19, a width 610Wg1 of the first rib 610R_g1 may be greater than a width 610Wg2 of the second rib 610R_g2, and a width 610Wg2 of the second rib 610R_g2 may be greater than a width 610Wg3 of the third rib 610R_g3.

The first rib 610R_g1 may be disposed in a center of the accommodation groove HA. The third rib 610R_g3 may be disposed at an outermost side in the accommodation groove HA. The second rib 610R_g2 may be disposed between the first rib 610R_g1 and the third rib 610R_g3.

A plurality of slits 610S_g may be defined between the first rib 610R_g1 and the second rib 610R_g2 and between the second rib 610R_g2 and the third rib 610R_g3. The plurality of slits 610S_g may have a same width 610Dg as each other. In such an embodiment, the first rib 610R_g1, the second rib 610R_g2, and the third rib 610R_g3 may be disposed at regular intervals.

In such an embodiment, other features of the plurality of slits 610S_g and the plurality of ribs 610R_g1, 610R_g2, and 610R_g3 may be substantially the same as or similar to those of the slit 610S and the rib 610R described above with reference to FIGS. 1 to 11, and any repetitive detailed description thereof will be omitted herein.

Figure 20:
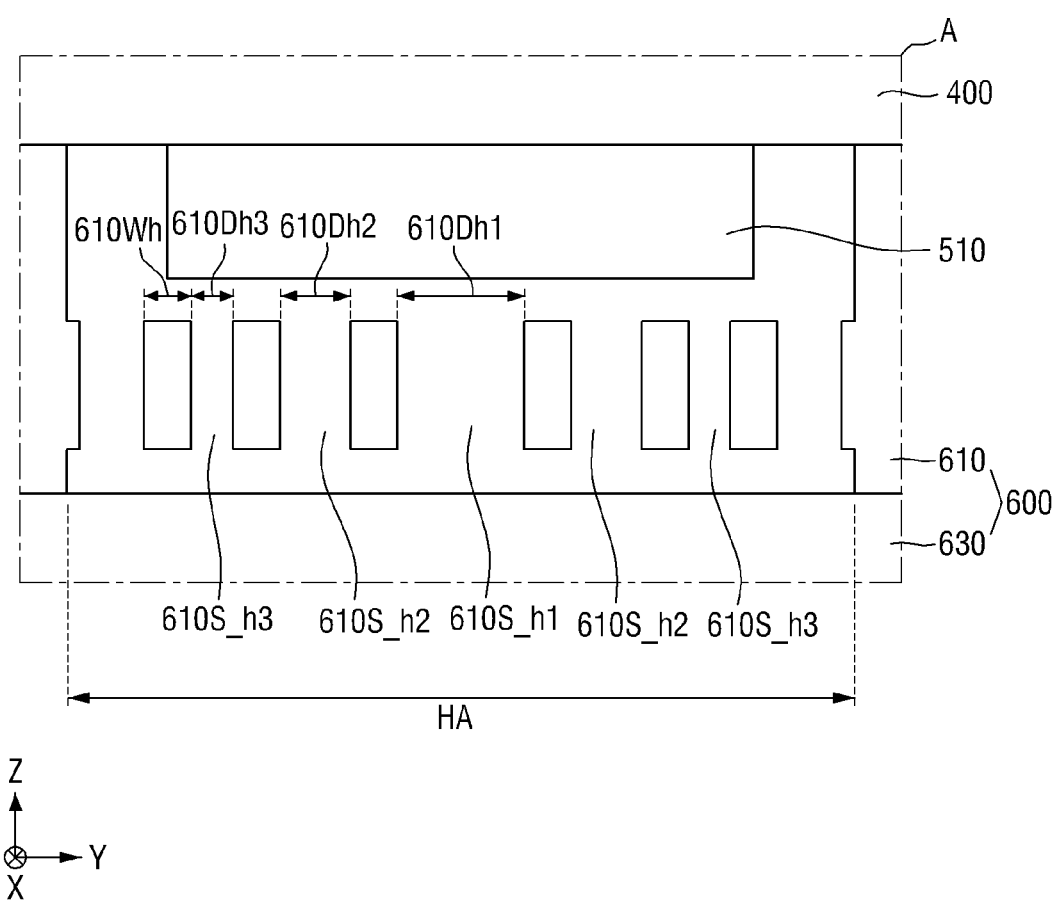
FIG. 20 is an enlarged cross-sectional view of a display device according to still another alternative embodiment.

FIG. 20 is an enlarged cross-sectional view of a display device according to yet another alternative embodiment.

Referring to FIG. 20, in such an embodiment, a plurality of slits 610S_h1, 610S_h2, and 610S_h3 are substantially the same as those of the embodiments described above with reference to FIGS. 1 to 11 except that the plurality of slits 610S_h1, 610S_h2, and 610S_h3 have widths increasing in a direction of a center of an accommodation groove HA.

In such an embodiment, the plurality of slits 610S_h1, 610S_h2, and 610S_h3 may include a first slit 610S_h1, a second slit 610S_h2, and a third slit 610S_h3 which have different widths from each other.

A width 610Dh1 of the first slit 610S_h1 may be greater than a width 610Dh2 of the second slit 610S_h2, and a width 610Dh2 of the second slit 610S_h2 may be greater than a width 610Dh3 of the third slit 610S_h3.

The first slit 610S_h1 may be disposed in a center of the accommodation groove HA. The third slit 610S_h3 may be disposed at an outermost side in the accommodation groove HA. The second slit 610S_h2 may be disposed between the first slit 610S_h1 and the third slit 610S_h3.

A plurality of ribs 610R_h may be defined between the first slit 610S_h1 and the second slit 610S_h2 and between the second slit 610S_h2 and the third slit 610S_h3. The plurality of ribs 610R_h may have a same width 610Wh as each other. In such an embodiment, the first slit 610S_h1, the second slit 610S_h2, and the third slit 610S_h3 may be disposed at regular intervals.

In such an embodiment, other features of the plurality of slits 610S_h1, 610S_h2, and 610S_h3 and the plurality of ribs 610R_h may be substantially the same as or similar to those of the slit 610S and the rib 610R described above with reference to FIGS. 1 to 11, and thus any repetitive detailed description thereof will be omitted herein.

Figure 21:
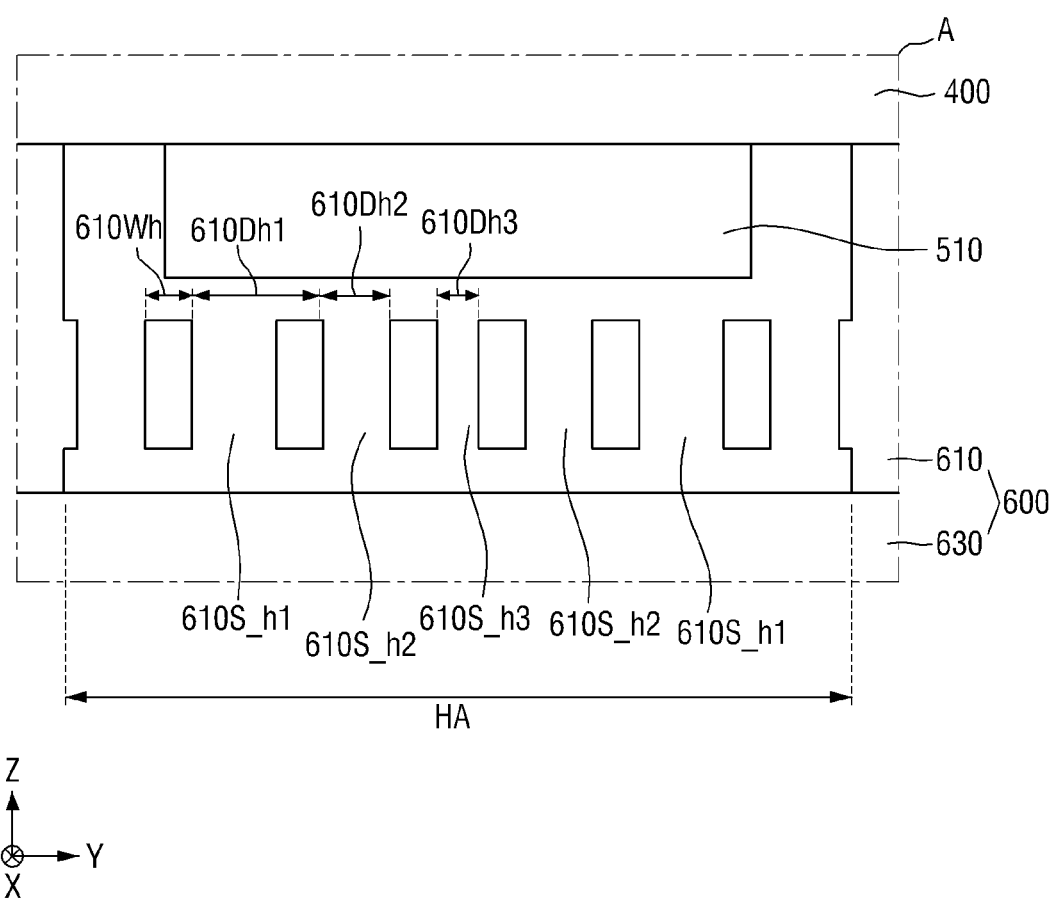
FIG. 21 is an enlarged cross-sectional view of a display device according to yet another alternative embodiment.

FIG. 21 is an enlarged cross-sectional view of a display device according to yet another alternative embodiment.

Referring to FIG. 21, in such an embodiment, a plurality of slits 610S_h1, 610S_h2, and 610S_h3 are substantially the same as those of the embodiments of FIG. 20 except that the plurality of slits 610S_h1, 610S_h2, and 610S_h3 have widths decreasing in a direction of a center of an accommodation groove HA.

In such an embodiment, the plurality of slits 610S_h1, 610S_h2, and 610S_h3 may include a first slit 610S_h1, a second slit 610S_h2, and a third slit 610S_h3 which have different widths from each other.

A width 610Dh1 of the first slit 610S_h1 may be greater than a width 610Dh2 of the second slit 610S_h2, and a width 610Dh2 of the second slit 610S_h2 may be greater than a width 610Dh3 of the third slit 610S_h3.

The first slit 610S_h1 may be disposed at an outermost side in the accommodation groove HA. The third slit 610S_h3 may be disposed in a center of the accommodation groove HA. The second slit 610S_h2 may be disposed between the first slit 610S_h1 and the third slit 610S_h3.

A plurality of ribs 610R_h may be defined between the first slit 610S_h1 and the second slit 610S_h2 and between the second slit 610S_h2 and the third slit 610S_h3. The plurality of ribs 610R_h may have a same width 610Wh as each other. In such an embodiment, the first slit 610S_h1, the second slit 610S_h2, and the third slit 610S_h3 may be disposed at regular intervals.

In such an embodiment, other features of the plurality of slits 610S_h1, 610S_h2, and 610S_h3 and the plurality of ribs 610R_h may be substantially the same as or similar to those of the slit 610S and the rib 610R described above with reference to FIGS. 1 to 11, and any repetitive detailed description thereof will be omitted herein.

Figure 22:
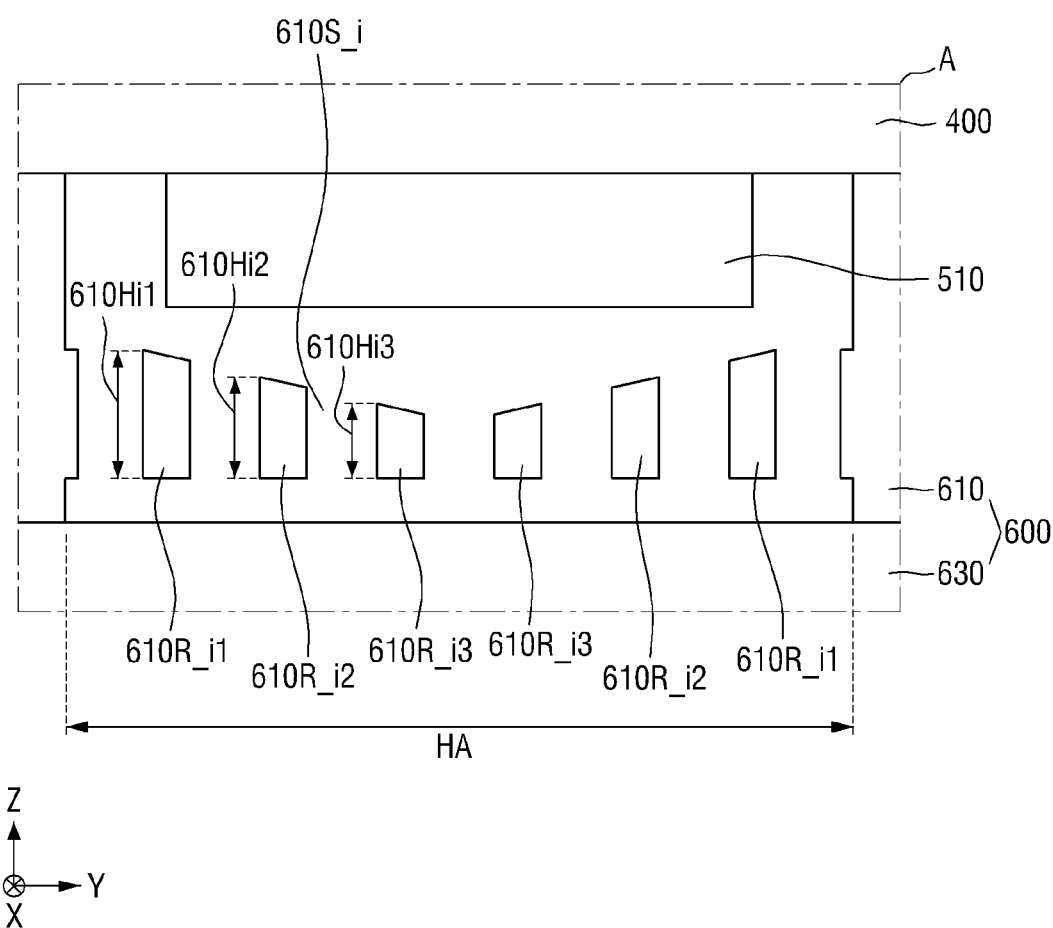
FIG. 22 is an enlarged cross-sectional view of a display device according to yet another alternative embodiment.

FIG. 22 is an enlarged cross-sectional view of a display device according to yet another alternative embodiment.

Referring to FIG. 22, a plurality of ribs 610R_i1, 610R_i2, and 610R_i3 are substantially the same as those of the embodiments described above with reference to FIGS. 1 to 11 except that heights of the plurality of ribs 610R_i1, 610R_i2, and 610R_i3 become smaller in a direction of a center of an accommodation groove HA.

In such an embodiment, the plurality of ribs 610R_i1, 610R_i2, and 610R_i3 may include a first rib 610R_i1, a second rib 610R_i2, and a third rib 610R_i3 which have different heights from each other.

A maximal height 610Hi1 of the first rib 610R_i1 may be greater than a maximal height 610Hi2 of the second rib 610R_i2, and the maximal height 610Hi2 of the second rib 610R_i2 may be greater than a maximal height 610Hi3 of the third rib 610R_i3.

The first rib 610R_i1 may be disposed at an outermost side in the accommodation groove HA. The third rib 610R_i3 may be disposed in a center of the accommodation groove HA. The second rib 610R_i2 may be disposed between the first rib 610R_i1 and the third rib 610R_i3. In such an embodiment, the plurality of ribs 610R_i1, 610R_i2, and 610R_i3 may be disposed to have heights decreasing in a direction of a center of a sound generation device 510. Accordingly, in such an embodiment, a size of a sound box space may be increased in a direction of the center of the sound generation device 510, a vibration or a sound generated from the sound generation device 510 may be effectively concentrated. In an embodiment, where a plurality of sound generation devices 510 are provided, sounds which are output from the sound generation devices 510 may be concentrated such that a channel effect may be easily realized.

An upper surface of each of the plurality of ribs 610R_i1, 610R_i2, and 610R_i3 may have a slope. That is, the upper surface of each of the plurality of ribs 610R 610R_i2, and 610R_i3 may form an inclined angle with respect to the second direction Y. The inclined angles of the upper surfaces of the ribs 610R_i1, 610R_i2, and 610R_i3 may be symmetrical with respect to the center of the sound generation device 510. The uppers surfaces of the ribs 610R_i1, 610R_i2, and 610R_i3 have slopes so that a height of one side of the upper surface of each of the ribs 610R_i1, 610R_i2 and 610R_i3 may be lower than that of the other side of the upper surface of each thereof. Here, the one side of the upper surface of each of the ribs 610R_i1, 610R_i2, and 610R_i3 may be a side adjacent to the center of the sound generation device 510. In such an embodiment, a larger sound box space may be secured in a direction of the center of the sound generation device 510 such that a vibration or a sound generated from the sound generation device 510 may be effectively concentrated. However, a shape of the upper surface of each of the plurality of ribs 610R_i1, 610R_i2, and 610R_i3 is not limited thereto, and alternatively, the upper surface of each thereof may have a shape parallel to the second direction Y.

In such an embodiment, other features of the plurality of ribs 610R_i1, 610R_i2, and 610R_i3 and the plurality of slits 610S_i may be substantially the same as or similar to those of the ribs 610R and the slits 610S described above with reference to FIGS. 1 to 11, and any repetitive detailed description thereof will be omitted herein.

Figure 23:
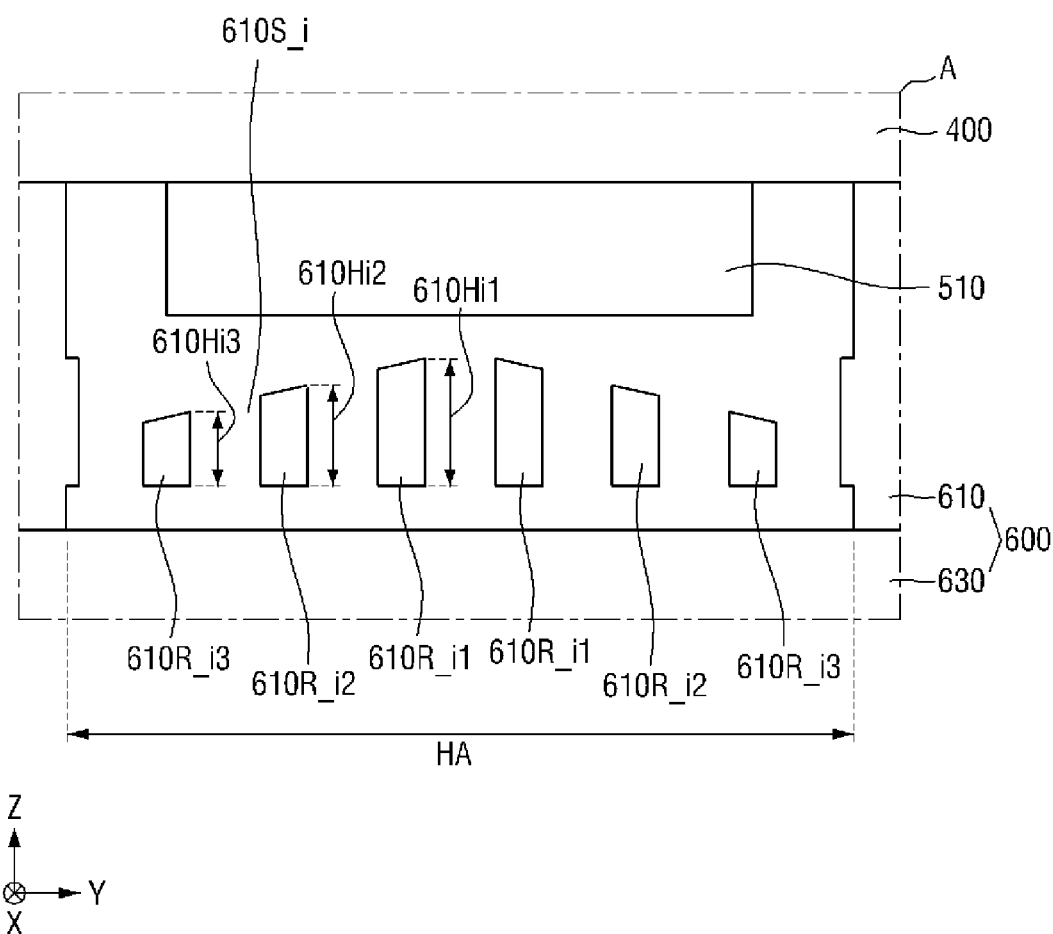
FIG. 23 is an enlarged cross-sectional view of a display device according to yet another alternative embodiment.

FIG. 23 is an enlarged cross-sectional view of a display device according to yet another alternative embodiment.

Referring to FIG. 23, in such an embodiment, a plurality of ribs 610R 610R_i2, and 610R_i3 are substantially the same as those of the embodiment of FIG. 22 except that heights of the plurality of ribs 610R_g1, 610R_g2, and 610R_g3 decrease in a direction of an outermost side of an accommodation groove HA.

In such an embodiment, the plurality of ribs 610R_i1, 610R_i2, and 610R_i3 may include a first rib 610R_i1, a second rib 610R_i2, and a third rib 610R_i3 which have different heights from each other.

A maximal height 610Hi1 of the first rib 610R_i1 may be greater than a maximal height 610Hi2 of the second rib 610R_i2, and the maximal height 610Hi2 of the second rib 610R_i2 may be greater than a maximal height 610Hi3 of the third rib 610R_i3.

The first rib 610R_i1 may be disposed in a center of the accommodation groove HA. The third rib 610R_i3 may be disposed at an outermost side in the accommodation groove HA. The second rib 610R_i2 may be disposed between the first rib 610R_i1 and the third rib 610R_i3. In such an embodiment, the plurality of ribs 610R_i1, 610R_i2, and 610R_i3 may be disposed to have heights increasing in a direction of a center of the sound generation device 510 and to have heights decreasing in a direction of an edge of the accommodation groove HA. Accordingly, a sufficient sound box space may be secured even at the edge of the accommodation groove HA, a vibration or a sound generated from the sound generation device 510 may be uniformly output over an entirety of the accommodation groove HA. Therefore, uniformity of the sound which is output from the display device may be improved.

An upper surface of each of the plurality of ribs 610R_i1, 610R_i2, and 610R_i3 may have a slope. That is, the upper surface of each of the plurality of ribs 610R 610R_i2, and 610R_i3 may form an inclined angle with respect to the second direction Y. The inclined angles of the upper surfaces of the ribs 610R_i1, 610R_i2, and 610R_i3 may be symmetrical with respect to the center of the sound generation device 510. The upper surfaces of the ribs 610R_i1, 610R_i2, and 610R_i3 have slopes so that a height of one side of the upper surface of each of the ribs 610R_i1, 610R_i2 and 610R_i3 may be lower than that of the other side of the upper surface of each thereof. Here, the one side of the upper surface of each of the ribs 610R_i1, 610R_i2, and 610R_i3 may be a side adjacent to the edge of the accommodation groove HA. In such an embodiment, since a sufficient sound box space may be secured even at the edge of the accommodation groove HA, a vibration or a sound generated from the sound generation device 510 may be uniformly output over an entirety of the accommodation groove HA. However, a shape of the upper surface of each of the plurality of ribs 610R_i1, 610R_i2, and 610R_i3 is not limited thereto, and alternatively, the upper surface of each thereof may have a shape parallel to the second direction Y.

In such an embodiment, other features of the plurality of ribs 610R_i1, 610R_i2, and 610R_i3 and the plurality of slits 610S_i may be substantially the same as or similar to those of the ribs 610R and the slits 610S described above with reference to FIGS. 1 to 11, and any repetitive detailed description thereof will be omitted herein.

Figure 24:
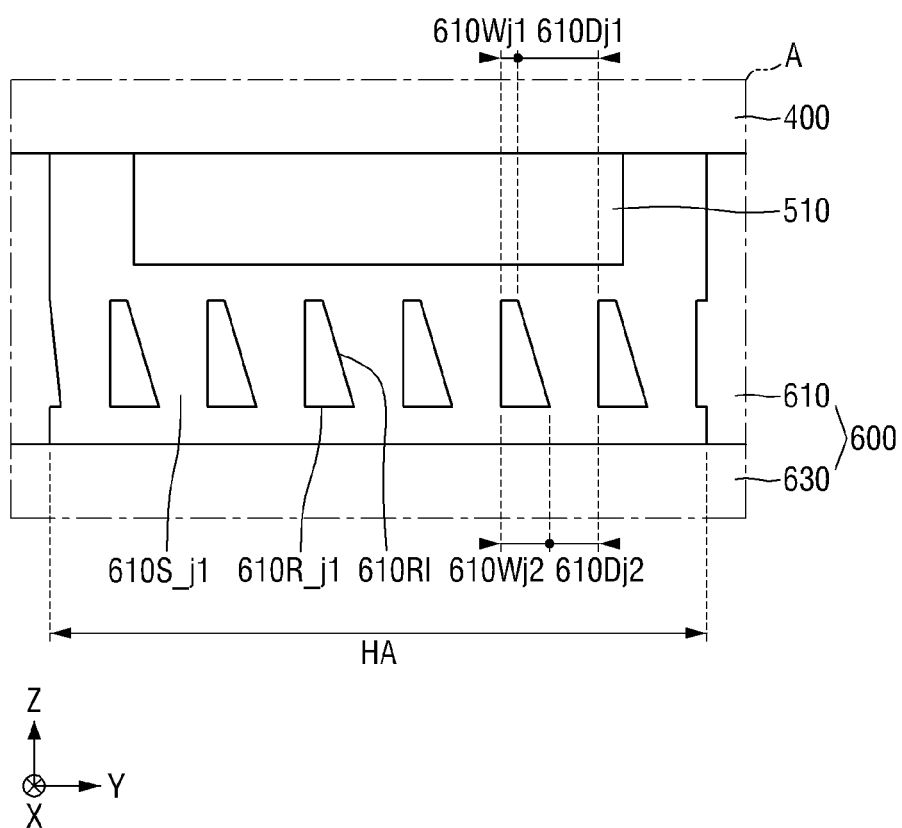
FIG. 24 is an enlarged cross-sectional view of a display device according to yet another alternative embodiment.

FIG. 24 is an enlarged cross-sectional view of a display device according to yet another alternative embodiment.

Referring to FIG. 24, in such an embodiment, a plurality of ribs 610R_j1 are substantially the same as those of the embodiments described above with reference to FIGS. 1 to 11 except that the plurality of ribs 610R_j1 include inclined portions 610RI.

In such an embodiment, a first side surface and a second side surface may be located between an upper surface and a lower surface of each of the plurality of ribs 610R_j1. Here, the upper surface of the rib 610R_j1 may be a surface facing a sound generation device 510, and the lower surface of the rib 610R_j1 may be a surface facing the upper surface thereof. In such an embodiment, a first side surface and a second side surface of the rib 610R_j1 may face each other, and the second side surface of the rib 610R_j1 may be a surface which is relatively disposed in the second direction Y.

The first side surface of the rib 610R_j1 may be perpendicular to the lower surface of the rib 610R_j1, and the second side surface of the rib 610R_j1 may include the inclined portion 610RI. In one embodiment, for example, an angle between the inclined portion 610RI of the second side surface of rib 610R_j1 and the lower surface of rib 610R_j1 may be an acute angle.

A width 610Wj1 of the upper surface of the rib 610R_j1 may be different from a width 610Wj2 of the lower surface thereof. In one embodiment, for example, the width 610Wj1 of the upper surface of the rib 610R_j1 may be smaller than the width 610Wj2 of the lower surface thereof.

In such an embodiment, a width 610Dj1 of an upper surface of the slit 610S_j1 may be different from a width 610Dj2 of a lower surface thereof. In one embodiment, for example, the width 610Dj1 of the upper surface of the slit 610S_j1 may be greater than the width 610Dj2 of the lower surface thereof.

In an embodiment, as shown in FIG. 24, the first side surface of the rib 610R_j1 may be perpendicular to the lower surface of the rib 610R_j1 and the second side surface of the rib 610R_j1 includes the inclined portion 610RI, but the disclosure is not limited thereto. Alternatively, the first side surface of the rib 610R_j1 may include the inclined portion 610RI, the second side surface thereof may be perpendicular to the lower surface of the rib 610R_j1, and both of the first side surface and the second side surface of the rib 610R_j1 may include the inclined portions 610RI.

In such an embodiment, other features of the plurality of slits 610S_j1 and the plurality of ribs 610R_j1 may be substantially the same as or similar to those of the slit 610S and the rib 610R described above with reference to FIGS. 1 to 11, and any repetitive detailed description thereof will be omitted herein.

Figure 25:
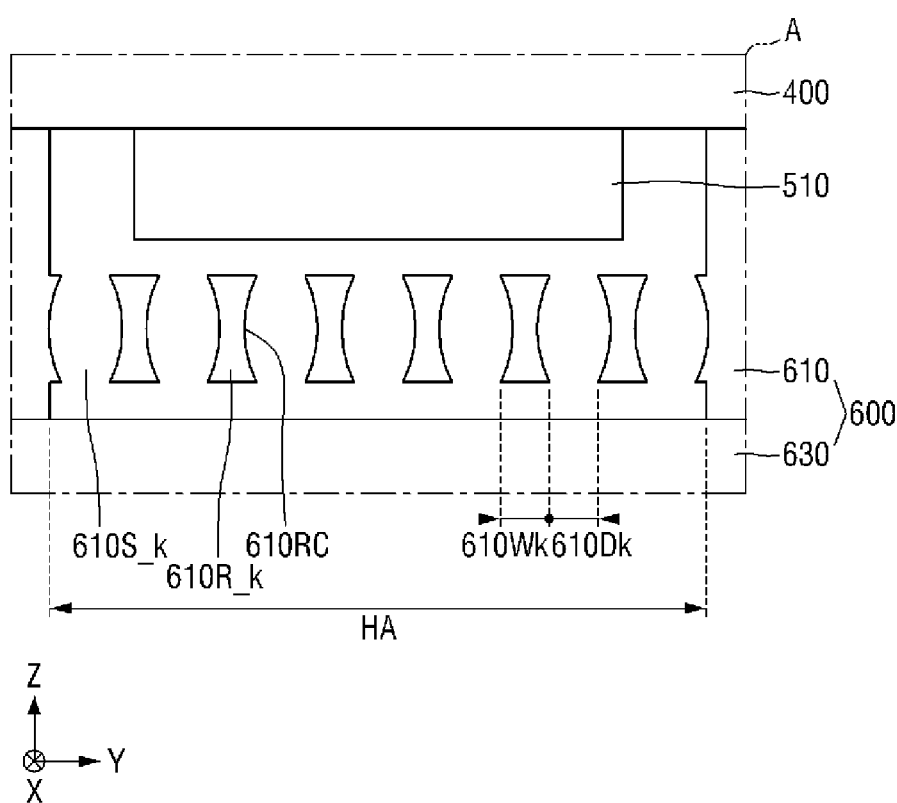
FIG. 25 is an enlarged cross-sectional view of a display device according to yet another alternative embodiment.

FIG. 25 is an enlarged cross-sectional view of a display device according to yet another alternative embodiment.

Referring to FIG. 25, in such an embodiment, a plurality of ribs 610R_k are substantially the same as those of the embodiments described above with reference to FIGS. 1 to 11 except that the plurality of ribs 610R_k include concave portions 610RC.

In such an embodiment, a first side surface and a second side surface may be located between an upper surface and a lower surface of each of the plurality of ribs 610R_k. Here, the upper surface of the rib 610R_k may be a surface facing a sound generation device 510, and the lower surface of the rib 610R_k may be a surface facing the upper surface thereof. Further, a first side surface and a second side surface of the rib 610R_k may face each other, and the second side surface of the rib 610R_k may be a surface which is relatively disposed in the second direction Y.

The first side surface and/or the second side surface of the rib 610R_k may include the concave portion 610RC. The concave portion 610RC may have a shape which is recessed in the rib 610R_k from one surface of the first side surface and/or the second side surface of the rib 610R_k. In such an embodiment, a width 610Wk of the rib 610R_k may be gradually decreased from the upper surface to the lower surface in the second direction Y and then increased again due to the concave portion 610RC. In an embodiment, the plurality of slits 610S_k may have a same width 610Dk as each other. In such an embodiment, a sound box space between the plurality of ribs 610R_k may be further expanded such that acoustic performance of the display device may be further improved.

Figure 26:
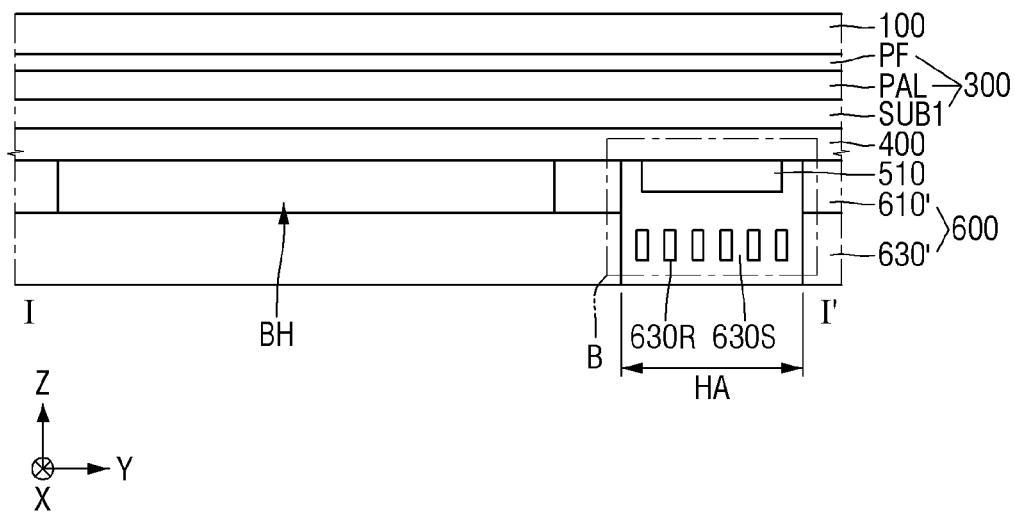
FIG. 26 is a cross-sectional view of a display device according to yet another embodiment.
Figure 27:
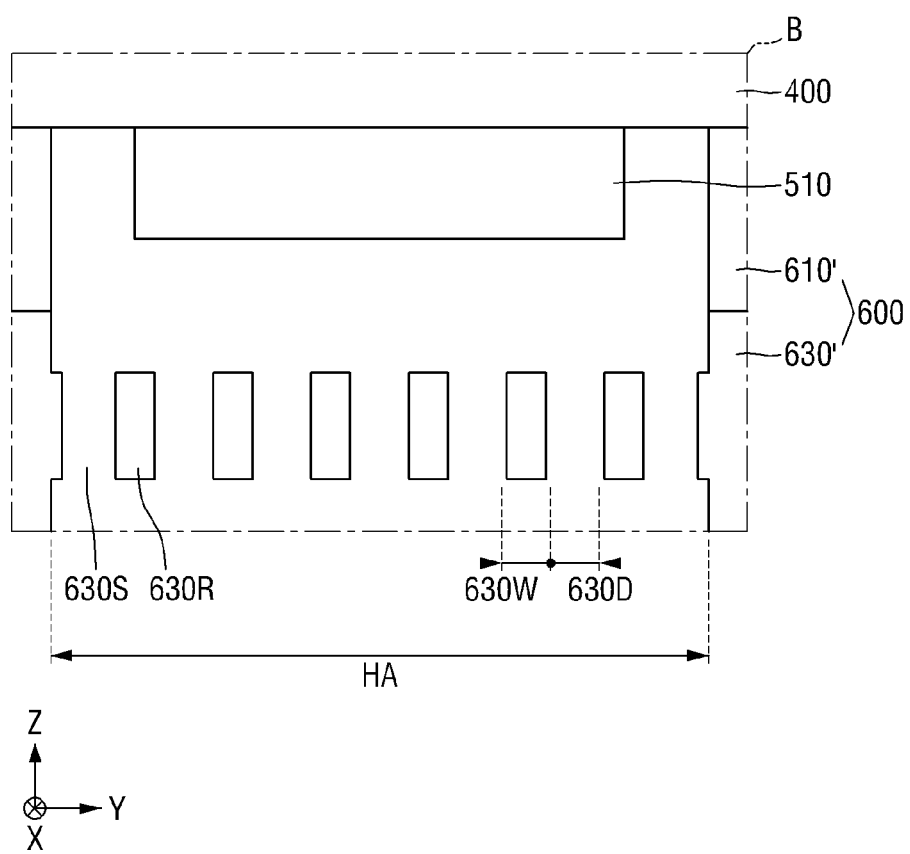
FIG. 27 is an enlarged cross-sectional view of area B of FIG. 26.

FIG. 26 is a cross-sectional view of a display device according to yet another alternative embodiment. FIG. 27 is an enlarged cross-sectional view of area B of FIG. 26.

Referring to FIGS. 26 and 27, in such an embodiment, a display device is substantially the same as the embodiments described above with reference to FIGS. 1 to 11 except that a lower cover 630' of a set cover 600 includes a plurality of slits 630S and a plurality of ribs 630R.

In such an embodiment, the lower cover 630' may include the plurality of slit 630S. The plurality of slits 630S may be defined through the lower cover 630' in the thickness direction (the third direction Z). In such an embodiment, the lower cover 630' may be partially removed. Consequently, as described above, since a sound box space in which a vibration or a sound wave provided from a sound generation device 510 is amplified may be expanded, acoustic performance of a display device may be improved.

A plurality of ribs 630R may be defined between the slits 630S of the lower cover 630'. The plurality of ribs 630R may be divided by the plurality of slits 630S disposed therebetween. Further, the plurality of slits 630S may be divided by the plurality of ribs 630R disposed therebetween.

A thickness of the rib 630R may be smaller than an average thickness of the lower cover 630'. Thus, elasticity of an area in which the ribs 630R are disposed may be partially increased. Accordingly, damage to the sound generation device 510 due to an external impact may be prevented more effectively.

The plurality of ribs 630R may be disposed at regular intervals. Widths 630W of the plurality of ribs 630R may be substantially the same as each other. Here, the width 630W of the rib 630R may mean a width in the second direction Y.

In such an embodiment, the plurality of slits 630S may be disposed at regular intervals. Widths 630D of the plurality of slits 630S may be substantially identical to each other. Here, the width 630D of the slit 630S may mean a width in the second direction Y.

In an embodiment, the width 630W of the rib 630R may be different from the width 630D of the slit 630S. In such an embodiment, the width 630W of the rib 630R may be smaller than the width 630D of the slit 630S. In such an embodiment, as an area of the rib 630R increases, elasticity of the lower cover 630' may increase.

The plurality of slits 630S and the plurality of ribs 630R of the lower cover 630' may overlap the sound generation device 510 in the thickness direction (the third direction Z). In an embodiment, the slit 630S and the rib 630R may overlap an accommodation groove HA of a bracket 610' in the thickness direction (the third direction Z). An opening defined through the bracket 610' in the thickness direction (the third direction Z) may be disposed in the accommodation groove HA of the bracket 610'. The opening may expose the sound generation device 510 at the lower cover 630'. In such an embodiment, a lower surface of the sound generation device 510 may face the plurality of slits 630S and the plurality of ribs 630R of the lower cover 630' through the opening of the bracket 610'. Accordingly, as described above, even when a display panel 300 is deformed due to an external impact applied to a display device 10 so that the sound generation device 510 disposed below the display panel 300 collides with the lower cover 630', an impact applied to the sound generation device 510 may be alleviated due to elasticity of the plurality of slits 630S and the plurality of ribs 630R.

In such an embodiment, other features of the slit 630S and the rib 630R of the lower cover 630' may be substantially the same as or similar to those of the slit 610S and the rib 610R described above with reference to FIGS. 1 to 11, and any repetitive detailed description thereof will be omitted herein.

Figure 28:
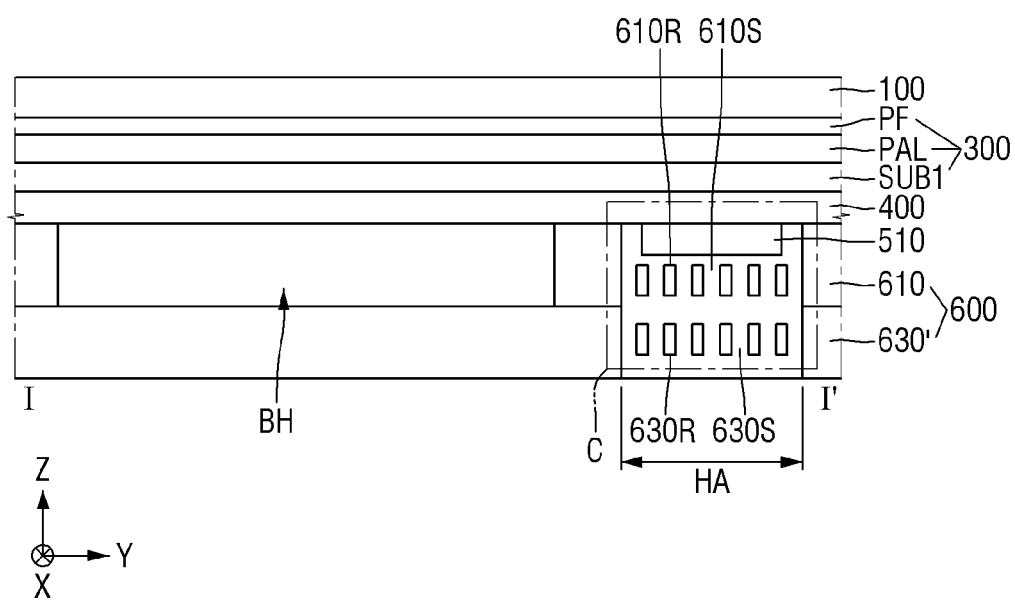
FIG. 28 is a cross-sectional view of a display device according to yet another alternative embodiment.
Figure 29:
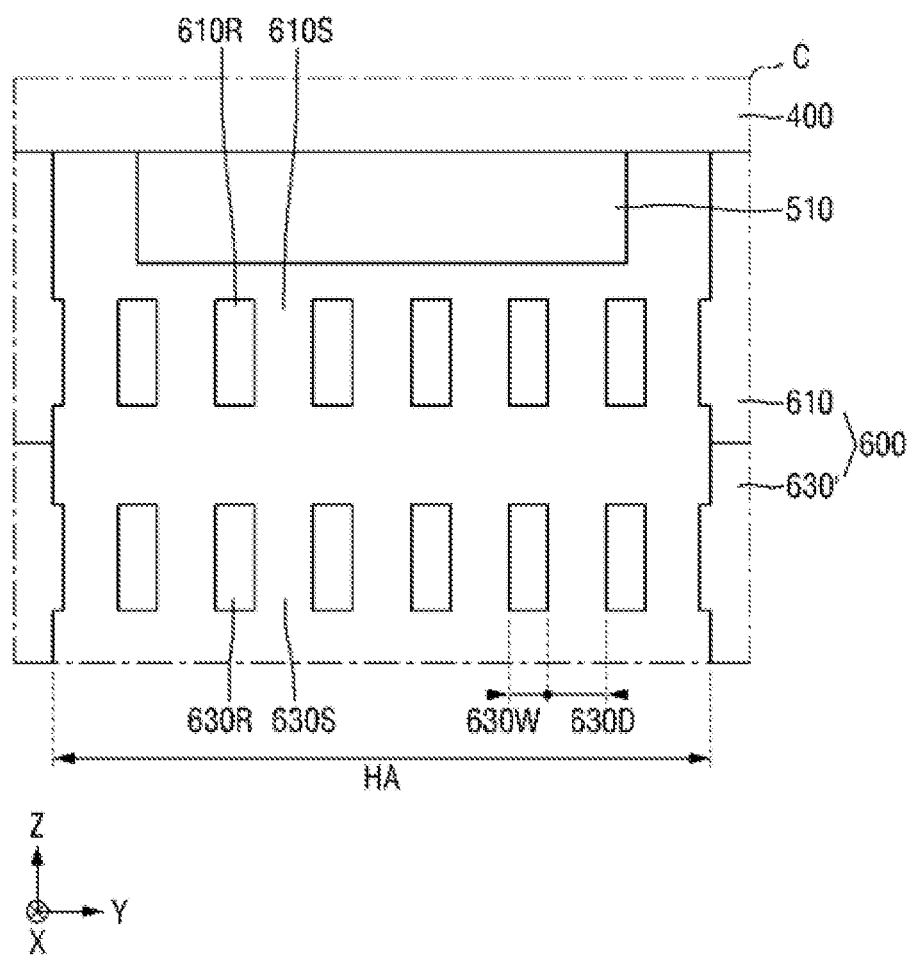
FIG. 29 is an enlarged cross-sectional view of area C of FIG. 28.

FIG. 28 is a cross-sectional view of a display device according to yet another alternative embodiment. FIG. 29 is an enlarged cross-sectional view of area C of FIG. 28.

Referring to FIGS. 28 and 29, in such an embodiment, a display device is substantially the same as the embodiments described with reference to FIGS. 1 to 11 except that a bracket 610 and a lower cover 630' of a set cover 600 includes a plurality of slits 610S and 630S and a plurality of ribs 610R and 630R.

In such an embodiment, the plurality of slits 610S and the plurality of ribs 610R of the bracket 610 may be disposed to overlap the plurality of slits 630S and the plurality of ribs 630R of the lower cover 630' in the thickness direction (the third direction Z). The slit 610S and the rib 610R of the bracket 610 may be arranged with the slit 630S and the rib 630R of the lower cover 630', respectively. That is, the slit 610S of the bracket 610 may overlap the slit 630S of the lower cover 630' in the thickness direction (the third direction Z), and the rib 610R of the bracket 610 may overlap the rib 630R of the lower cover 630' in the thickness direction (the third direction Z).

The rib 610R of the bracket 610 is disposed to be spaced apart from the rib 630R of the lower cover 630' in the thickness direction (the third direction Z) so that a lower surface of the rib 610R of the bracket 610 may face an upper surface of the rib 630R of the lower cover 630'. In such an embodiment, a sound box space may be further expanded such that acoustic performance of the display device may be improved. Consequently, as described above, even when a display panel 300 is deformed due to an external impact applied to a display device 10 so that the sound generation device 510 disposed below the display panel 300 collides with the bracket 610 or the lower cover 630', an impact applied to the sound generation device 510 may be alleviated due to elasticity of the plurality of slits 610S and 630S and the plurality of ribs 610R and 630R.

In such embodiments, other features of the slits 610S and 630S and the ribs 610R and 630R of the bracket 610 and the lower cover 630' may be substantially the same as or similar to those of the slit 610S and the rib 610R of the bracket 610 described above, and any repetitive detailed description thereof will be omitted herein.

Figure 30:
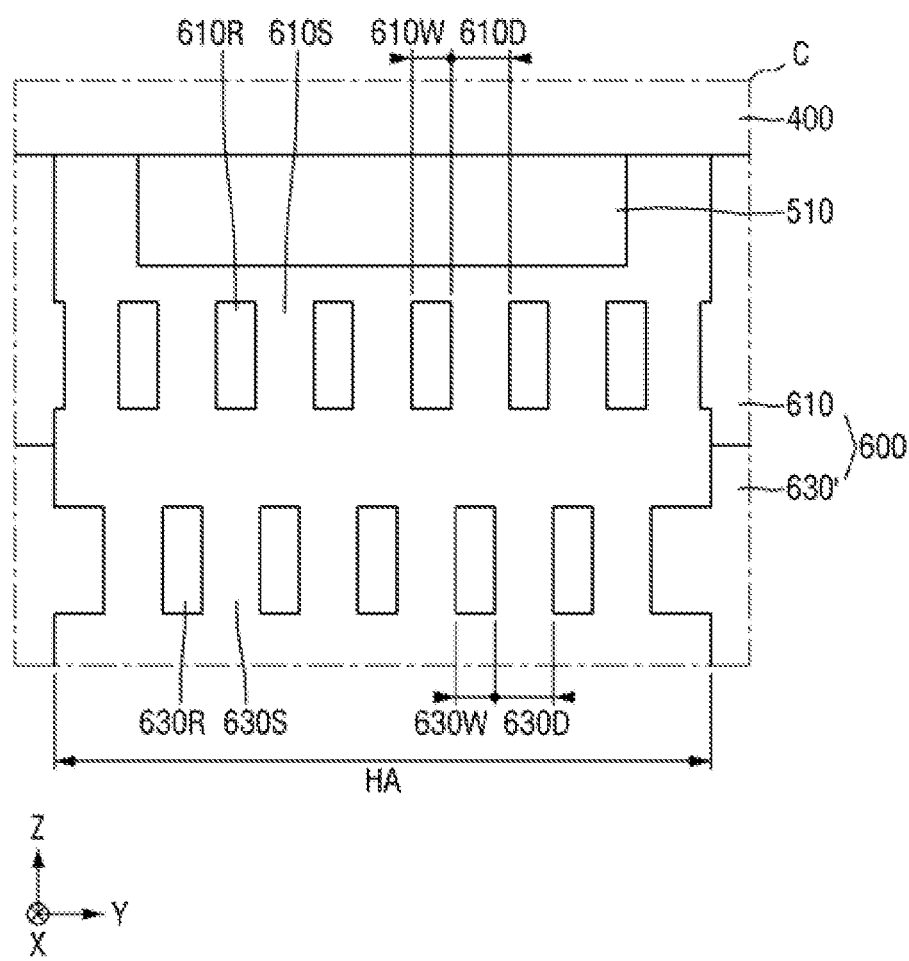
FIG. 30 is an enlarged cross-sectional view of a display device according to yet another alternative embodiment.

FIG. 30 is an enlarged cross-sectional view of a display device according to yet another alternative embodiment.

Referring to FIG. 30, in such an embodiment, a display device is substantially the same as the embodiment of FIGS. 28 to 29 except that a plurality of slits 610S and 630S and a plurality of ribs 610R and 630R of a bracket 610 and a lower cover 630' are alternately disposed with each other or in a zig-zag arrangement.

In such an embodiment, when viewed in a plan view, the slit 610S of the bracket 610 and the slit 630S of the lower cover 630' may be alternately disposed with each other in the second direction Y. In such an embodiment, the slit 630S of the lower cover 630' may be disposed between the plurality of slits 610S of the bracket 610.

In such an embodiment, when viewed in a plan view, the rib 610R of the bracket 610 and the rib 630R of the lower cover 630' may be alternately disposed in the second direction Y. In such an embodiment, the rib 630R of the lower cover 630' may be disposed between the ribs 610R of the bracket 610.

The slit 610S of the bracket 610 may overlap the rib 630R of the lower cover 630' in the thickness direction (the third direction Z), and the rib 610R of the bracket 610 may overlap the slit 630S of the lower cover 630' in the thickness direction (the third direction Z). Further, the slit 610S of the bracket 610 may not overlap the slit 630S of the lower cover 630' in the thickness direction (the third direction Z), and the rib 610R of the bracket 610 may not overlap the rib 630R of the lower cover 630' in the thickness direction (the third direction Z). In such an embodiment, even when a sound generation device 510 collides with a set cover 600 and thus the rib 610R of the bracket 610 descends, the rib 610R may be accommodated in a space between the ribs 630R of the lower cover 630', i.e., the slit 630S of the lower cover 630', and thus elasticity of the set cover 600 may be further increased.

A width 610W of the rib 610R of the bracket 610 may be smaller than a width 630D of the slit 630S of the lower cover 630'. In such an embodiment, a width 610D of the slit 610S of the bracket 610 may be greater than a width 630W of the rib 630R of the lower cover 630'. Accordingly, the rib 610R of the bracket 610 may completely overlap the slit 630S of the lower cover 630', and the rib 630R of the lower cover 630' may completely overlap the slit 610S of the bracket 610.

In such an embodiment, other features of the slits 610S and 630S and the ribs 610R and 630R of the bracket 610 and the lower cover 630' may be substantially the same as or similar to those of the slit 610S and the rib 610R of the bracket 610 described above, and any repetitive detailed description thereof will be omitted herein.

In accordance with embodiments of a display device according to the invention, a plurality of slits and a plurality of ribs are disposed in a set cover so that a sound box space, in which a vibration or a sound wave provided from a sound generation device is amplified, may be effectively secured such that acoustic performance of the display device can be improved.

In such embodiments, heat generated due to driving of the sound generation device may be effectively discharged through a slit and rib structure such that a heat dissipation characteristic of the display device may be improved. Therefore, it is possible to prevent or minimize degradation in image quality of a display panel due to heat generation of the sound generation device.

In such embodiments, an external impact applied to the display panel or the sound generation device may be alleviated due to the slit and rib structure. Accordingly, damage to the display device due to an external impact may be effectively prevented.

The invention should not be construed as being limited to the exemplary embodiments set forth herein. Rather, these embodiments are provided so that this invention will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a display panel including a substrate and a pixel array layer disposed on a surface of the substrate;
   a sound generation device disposed on an opposing surface opposite the surface of the substrate, wherein the sound generation device vibrates the display panel to output a sound; and
   a set cover including:
   a bracket having a plurality of ribs which overlap the sound generation device in a thickness direction of the display panel; and
   a lower cover disposed on the bracket,
   wherein each of the plurality of ribs includes an upper surface, a lower surface, and side surfaces, and a space is defined between the sound generation device and the upper surface, and between a surface defining the lower cover and the lower surface.

2. The display device of claim 1, wherein the plurality of ribs extends in a first direction and arranged in a second direction crossing the first direction.

3. The display device of claim 2, wherein
   the bracket is disposed between the display panel and the lower cover.

4. The display device of claim 3, wherein
   a slit is defined in the bracket between adjacent ribs among the plurality of ribs, and
   the slit is defined through the bracket in the thickness direction.

5. The display device of claim 4, wherein a width of the rib in the second direction is smaller than a width of the slit in the second direction.

6. The display device of claim 5, wherein the sound generation device includes:

a first electrode to which a first driving voltage is applied;

a second electrode to which a second driving voltage is applied; and a vibration layer between the first electrode and the second electrode, wherein the vibration layer retracts or expands based on the first driving voltage and the second driving.

7. The display device of claim 4, wherein the rib includes an upper surface, a lower surface, and a side surface disposed between the upper surface and the lower surface, and a width of the upper surface in the second direction is smaller than a width of the lower surface in the second direction.

8. The display device of claim 4, wherein the rib includes an upper surface, a lower surface, a first side surface disposed between the upper surface and the lower surface, and a second side surface facing the first side surface, the first side surface is perpendicular to the lower surface, and the second side surface includes an inclined surface forming an acute angle with respect to the lower surface.

9. A display device comprising:

a display panel including a substrate and a pixel array layer disposed on a surface of the substrate;

a sound generation device disposed on an opposing surface opposite the surface of the substrate, wherein the sound generation device vibrates the display panel to output a sound; and a set cover including a plurality of ribs which overlap the sound generation device in a thickness direction of the display panel, wherein the set cover includes a lower cover and a bracket disposed between the display panel and the lower cover, and the ribs are disposed in the lower cover.

10. The display device of claim 9, wherein a slit is defined in the lower cover between adjacent ribs among the plurality of ribs, and the slit is defined through the lower cover in the thickness direction.

11. The display device of claim 10, wherein an opening is defined through the bracket to expose the sound generation device, and the opening overlaps the rib and the slit of the lower cover in the thickness direction.

12. The display device of claim 11, wherein a width of the rib is smaller than a width of the slit.

13. The display device of claim 12, wherein the rib includes an upper surface, a lower surface, and a side surface disposed between the upper surface and the lower surface, and a width of the upper surface is smaller than a width of the lower surface.

14. The display device of claim 13, wherein the side surface of the rib includes a first side surface and a second side surface facing the first side surface, the first side surface is perpendicular to the lower surface, and the second side surface includes an inclined surface forming a predetermined angle with respect to the lower surface.

15. A display device comprising:

a display panel;

a sound generation device attached to a surface of the display panel; and a bracket which accommodates the display panel and the sound generation device, wherein the bracket includes a plurality of slits and a plurality of ribs which overlap the sound generation device in a thickness direction of the display panel, wherein the plurality of slits and the plurality of ribs are alternately disposed in a lateral direction, and wherein each of the plurality of ribs includes an upper surface, a lower surface, and side surfaces and a space is defined between the sound generation device and the upper surface, and between a surface defining the lower cover disposed on the bracket and the lower surface.

16. The display device of claim 15, wherein the slits are defined through the bracket in the thickness direction.

17. The display device of claim 16, wherein a width of the rib in the lateral direction is smaller than a width of the slit in the lateral direction.

18. The display device of claim 17, wherein the sound generation device includes:

a first electrode to which a first driving voltage is applied;

a second electrode to which a second driving voltage is applied; and a vibration layer disposed between the first electrode and the second electrode, wherein the vibration layer retracts or expands based on the first driving voltage and the second driving voltage.

19. The display device of claim 18, wherein the width of the rib is smaller than a width of the bracket.

20. The display device of claim 16, wherein the rib includes an upper surface, a lower surface, and a side surface disposed between the upper surface and the lower surface, and a width of the upper surface in the lateral direction is smaller than a width of the lower surface in the lateral direction.

* * * * *